(12) United States Patent
Lee et al.

(10) Patent No.: US 9,934,723 B2
(45) Date of Patent: Apr. 3, 2018

(54) THIN FILM TRANSISTOR SUBSTRATE, DISPLAY PANEL INCLUDING THE SAME, AND METHOD OF MANUFACTURING THE SAME

(71) Applicant: LG DISPLAY CO., LTD., Seoul (KR)

(72) Inventors: Jung-Min Lee, Paju-si (KR); Juhn Suk Yoo, Seoul (KR); Ji No Lee, Paju-si (KR); Jae Soo Park, Goyang-si (KR); Chang Heon Kang, Paju-si (KR); Ho Young Ko, Paju-si (KR); Soo Hong Kim, Goyang-si (KR); Sung Ki Hong, Cheongwon-gun (KR)

(73) Assignee: LG DISPLAY CO., LTD., Seoul (KR)

( * ) Notice: Subject to any disclaimer, the term of this patent is extended or adjusted under 35 U.S.C. 154(b) by 346 days.

(21) Appl. No.: 14/739,799

(22) Filed: Jun. 15, 2015

(65) Prior Publication Data

US 2015/0379923 A1    Dec. 31, 2015

(30) Foreign Application Priority Data

Jun. 25, 2014  (KR) .................. 10-2014-0078318
Dec. 3, 2014   (KR) .................. 10-2014-0172567
(Continued)

(51) Int. Cl.
*G06F 3/038*    (2013.01)
*G09G 3/3233*   (2016.01)
*H01L 27/32*    (2006.01)

(52) U.S. Cl.
CPC ....... *G09G 3/3233* (2013.01); *H01L 27/3272* (2013.01); *H01L 27/3279* (2013.01);
(Continued)

(58) Field of Classification Search
CPC ......... G09G 3/3233; G09G 2300/0426; G09G 2300/0814; G09G 2300/0819;
(Continued)

(56) References Cited

U.S. PATENT DOCUMENTS 9,619,063 B2    4/2017  Wei et al.
9,647,001 B2    5/2017  Li et al.
(Continued)

FOREIGN PATENT DOCUMENTS

CN    103489824 A    1/2014
CN    103713792 A    4/2014

*Primary Examiner* — Nelson Rosario
(74) *Attorney, Agent, or Firm* — Dentons US LLP

(57) ABSTRACT

An electronic display panel comprising a plastic substrate; a bottom shield metal (BSM) on the plastic substrate; a thin-film transistor (TFT) on the BSM, the TFT and the BSM at least partially overlapping each other; and an active buffer layer between the TFT and the BSM, wherein the BSM is connected to one of a gate electrode, a source electrode, and a drain electrode of the TFT. A bottom shield metal (BSM) on the plastic substrate, the BSM located to minimize formation of a back channel in a pixel circuit by trapped charges of the plastic substrate, the pixel circuit in a pixel area defined by a gate line and a data line on the plastic substrate, the pixel circuit on the active buffer layer including a plurality of TFTs and a plurality of component interconnecting nodes.

14 Claims, 19 Drawing Sheets

(30) Foreign Application Priority Data

Dec. 3, 2014 (KR) .......................... 10-2014-0172570
Dec. 26, 2014 (KR) .......................... 10-2014-0191052
Apr. 28, 2015 (KR) .......................... 10-2015-0060058

(52) U.S. Cl.
CPC .............. *G09G 2300/0426* (2013.01); *G09G 2300/0814* (2013.01); *G09G 2300/0819* (2013.01); *G09G 2300/0852* (2013.01); *G09G 2300/0861* (2013.01); *G09G 2300/0866* (2013.01); *G09G 2380/02* (2013.01); *H01L 27/3262* (2013.01); *H01L 2227/323* (2013.01); *H01L 2227/326* (2013.01)

(58) Field of Classification Search
CPC ... G09G 2300/0852; G09G 2300/0861; G09G 2300/0866; G09G 2380/02; H01L 27/3272; H01L 27/3279; H01L 2227/323; H01L 2227/326; H01L 27/3262
See application file for complete search history.

(56) References Cited

U.S. PATENT DOCUMENTS

| | | | |
|---|---|---|---|
| 2013/0100005 A1 | 4/2013 | Shih et al. | |
| 2013/0300968 A1* | 11/2013 | Okajima | G02F 1/136209 349/43 |
| 2015/0060863 A1* | 3/2015 | Li | H01L 27/124 257/71 |
| 2015/0277172 A1* | 10/2015 | Sekine | G02F 1/13306 349/43 |

\* cited by examiner (a)

(b)

(a)

(b)

(a)

(b)

THIN FILM TRANSISTOR SUBSTRATE, DISPLAY PANEL INCLUDING THE SAME, AND METHOD OF MANUFACTURING THE SAME

CROSS-REFERENCE TO RELATED APPLICATIONS

This application claims the benefit of the Korean Patent Application Nos. 10-2014-0078318 filed on Jun. 25, 2014; 10-2014-0172567 filed on Dec. 3, 2014; 10-2014-0172570 filed on Dec. 3, 2014; 10-2014-0191052 filed on Dec. 26, 2014; and 10-2015-0060058 filed Apr. 28, 2015 which are all incorporated by reference in their entirety for all purposes as if fully set forth herein.

BACKGROUND

Field of the Disclosure

The present disclosure relates to a thin film transistor (TFT) substrate, and particularly, to a TFT substrate including a TFT formed on a plastic substrate, a display panel including the same, and a method of manufacturing the same.

Discussion of the Related Art

As the times advance in an information-oriented society, flat panel display (FPD) devices which have good characteristics such as thin, light weight, and low power consumption are increasing in importance. Examples of FPD devices include liquid crystal display (LCD) devices, plasma display panels (PDPs), organic light-emitting display devices, etc. Recently, electrophoretic display (EPD) devices are being widely used as one type of FPD device.

A display panel used in a display device is manufactured with a glass carrier, a quartz substrate, or the like. However, the above-described substrates are easily cracked and are heavy. Therefore, the glass carrier and the quartz substrate are not suitable for manufacturing a flexible display device. Therefore, a method of forming a TFT on a substrate (for example, flexible plastic) having flexibility is being applied for manufacturing a flexible display device.

A TFT is being widely used as a switching element in a display panel such as a liquid crystal panel or an organic light-emitting display panel. Therefore, a TFT substrate where a TFT is formed is a fundamental element of a display panel configured for a display device.

To provide an additional description, recently research for flexible display panels is being actively pursued. The flexible display panel needs to be able to be bent or curved. Therefore, instead of glass, a polymer material (i.e., plastic) such as polyimide (PI) is being used as a material of a TFT substrate.

FIG. 1 is a circuit diagram for describing a pixel structure of a related art organic light-emitting display panel.

A pixel P of the related art organic light-emitting display panel, as illustrated in FIG. 1, includes an organic light-emitting diode (OLED), a switching transistor Tsw, a driving transistor Tdr, and a capacitor Cst. In FIG. 1, the switching transistor Tsw and the driving transistor Tdr are implemented in an N-type, but are not limited thereto. For example, the switching transistor Tsw and the driving transistor Tdr may be implemented in a P-type.

Each of the switching transistor and the driving transistor is configured with a TFT.

FIG. 2 is a cross-sectional view of one pixel of a related art flexible organic light-emitting display panel.

In the related art flexible organic light-emitting display panel, as illustrated in FIG. 2, a lower substrate 10 formed of plastic is attached to an auxiliary substrate A. An organic light-emitting diode (OLED) connected to a driving transistor Tdr is formed on the lower substrate 10. The auxiliary substrate A includes a glass carrier 80 and a sacrificial layer 85. The auxiliary substrate A is detached from the lower substrate 10, where the OLED is formed, through a laser release process.

SUMMARY

Accordingly, the present invention is directed to provide a TFT substrate, a display panel including the same, and a method of manufacturing the same that substantially obviate one or more problems due to limitations and disadvantages of the related art.

An aspect of the present invention is directed to provide a TFT substrate including a buffer where a bottom shield metal (BSM) is provided, a display panel including the same, and a method of manufacturing the same.

In an aspect of the invention an electronic display panel comprising a plastic substrate; a bottom shield metal (BSM) on the plastic substrate; a thin-film transistor (TFT) on the BSM, the TFT and the BSM at least partially overlapping each other; and an active buffer layer between the TFT and the BSM, wherein the BSM is connected to one of a gate electrode, a source electrode, and a drain electrode of the TFT.

In another aspect of the invention an electronic display panel comprising a plastic substrate; a bottom shield metal (BSM) on the plastic substrate, the BSM located to minimize formation of a back channel in a pixel circuit by trapped charges of the plastic substrate; an active buffer layer on the BSM; and the pixel circuit in a pixel area defined by a gate line and a data line on the plastic substrate, the pixel circuit on the active buffer layer including a plurality of TFTs and a plurality of component interconnecting nodes.

Additional advantages and features of the invention will be set forth in part in the description which follows and will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

In this disclosure below, an organic light-emitting display panel will be described as an example of the present invention, but the present invention is not limited thereto. That is, the present invention may be applied to various kinds of display panels including a TFT substrate.

Moreover, in the present specification, a flexible TFT substrate will be described as an example of the present invention, but the present invention is not limited thereto. That is, the present invention may be applied to various kinds of TFT substrates using a lower substrate made of a polymer material such as polyimide (PI).

Figure 1:
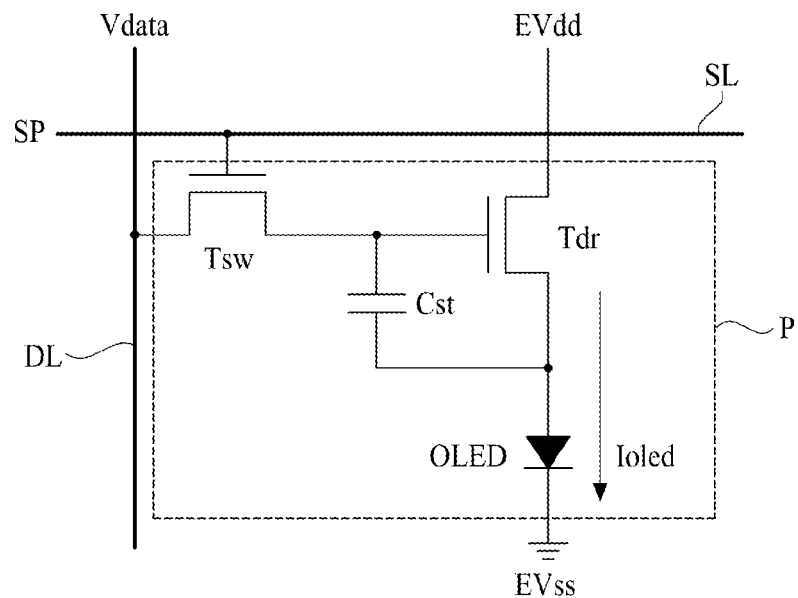
FIG. 1 is a circuit diagram for describing a pixel structure of a related art organic light-emitting display panel.
Figure 2:
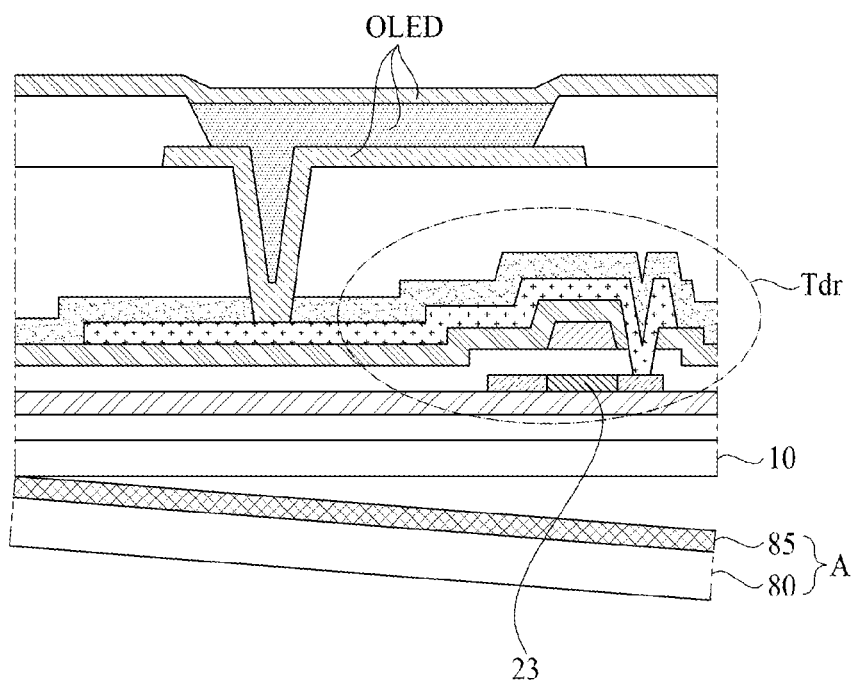
FIG. 2 is a cross-sectional view of one pixel of a related art flexible organic light-emitting display panel.

Referring to FIG. 2, in the related art flexible organic light-emitting display panel, an active layer 23 of the driving transistor Tdr formed on the lower substrate 10 can be damaged by a laser which is irradiated in an operation of detaching the auxiliary substrate A from the lower substrate 10.

Moreover, in the related art flexible organic light-emitting display panel, a threshold voltage "Vth" of the driving transistor Tdr is shifted due to a back channel phenomenon which is caused by the lower substrate 10 and the sacrificial layer 85.

To provide an additional description, in the related art flexible organic light-emitting display panel, an active layer of each of various transistors such as the driving transistor Tdr can be damaged by a laser. Also, a negative charge trap occurs in the sacrificial layer due to a laser and light input from the outside, and thus, positive (+) electric charges are moved from polyimide (PI), forming the lower substrate 10, to the sacrificial layer 85. Therefore, a potential of a surface of the lower substrate 10 increases. Accordingly, a threshold voltage (Vth) of each of a plurality of TFTs is shifted in a positive direction.

A uncontrollable shift of a threshold voltage degrades a reliability of an organic light-emitting display panel.

The degradation in the reliability of the organic light-emitting display panel can occur in the switching transistor Tsw. Also, a shift of the threshold voltage of the driving transistor or the switching transistor can occur due to various causes in addition to the above-described cause.

Second, a source of the driving transistor connected to the organic light-emitting diode OLED is maintained in a floating state when the driving transistor Tdr is not turned on. In this case, as a potential of the surface of the lower substrate 10 increases, a parasitic capacitance can be generated between the lower substrate 10 and the source, and the source can be continuously affected by the parasitic capacitance. Therefore, a current flowing in the source can be shifted by the parasitic capacitance, and for this reason, image sticking can occur.

Third, when an internal-compensation transistor connected to an initialization voltage supply line is connected to the source so as to compensate for the threshold voltage of the driving transistor Tdr, a parasitic capacitance is generated between the initialization voltage supply line and the source despite the source being floated (In this description, the 'floated' means being floated at least some period during an operation of the pixel circuit), and the source can be continuously affected by the parasitic capacitance. Therefore, a current flowing in the source can be shifted by the parasitic capacitance, and for this reason, image sticking can occur.

Fourth, the above-described phenomena can occur in a general TFT substrate as well as a flexible TFT substrate.

Fifth, the above-described phenomena can occur even when the TFT substrate is driven, in addition to a process of manufacturing the TFT substrate.

For example, when the TFT substrate including the lower substrate 10 formed of a plastic-based polymer material such as polyimide (PI) is driven, heat is generated in the lower substrate 10, and a particle having an electric charge generated from the lower substrate 10 is moved to an upper portion of the TFT structure. The particle having the electric charge affects the active layer 23 to degrade a reliability of the TFT substrate. Also, the particle having the electric charge causes a flow of an unnecessary current in addition to a flow of a normal current, and for this reason, a service life of the TFT substrate can be shortened.

Figure 3:
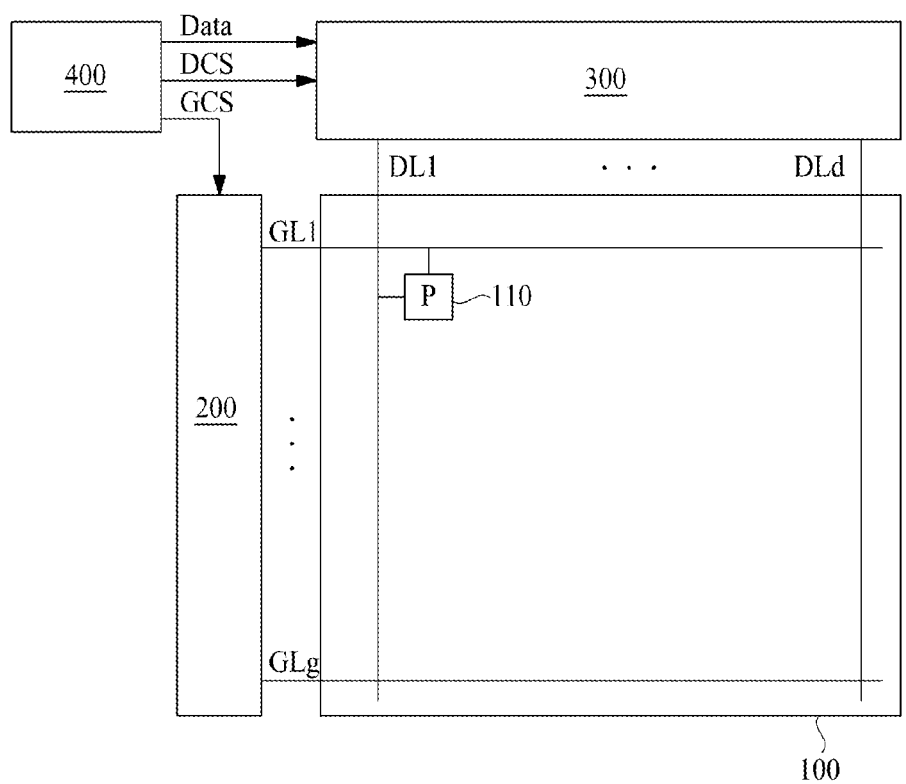
FIG. 3 is a diagram illustrating a configuration of an organic light-emitting display device to which a TFT substrate is applied, according to an embodiment of the present invention.

FIG. 3 is a diagram illustrating a configuration of an organic light-emitting display device to which a TFT substrate is applied, according to an embodiment of the present invention.

The organic light-emitting display device according to an embodiment of the present invention, as illustrated in FIG. 3, includes: an organic light-emitting display panel 100 where a pixel (P) 110 is provided in each of a plurality of crossing areas between a plurality of gate lines GL1 to GLg and a plurality of data lines DL1 to DLd; a gate driver 200 that sequentially supplies a scan pulse to the plurality of gate lines GL1 to GLg which are formed in the organic light-emitting display panel 100; a data driver 300 that respectively supplies data voltages to the plurality of data lines DL1 to DLd which are formed in the organic light-emitting display panel 100; and a timing controller 400 that controls a function of the gate driver 200 and a function of the data driver 300.

In the organic light-emitting display panel (hereinafter referred to as a display panel) 100, the pixel (P) 100 may be provided in each of the plurality of crossing areas between the plurality of gate lines GL1 to GLg and the plurality of data lines DL1 to DLd. The pixel 110 may include an organic light-emitting diode (OLED), which emits light, and a pixel driver that drives the OLED.

First, the OLED may be configured in a top emission type where the light emitted from the OLED is output to the outside through an upper substrate, or may be configured in a bottom emission type where the light emitted from the OLED is output to the outside through a lower substrate.

Second, the pixel driver may include two or more TFTs, which are connected to a data line DL and a gate line GL and controls driving of the OLED, and a storage capacitor.

An anode of the OLED may be connected to a first power source, and a cathode of the OLED may be connected to a second power source. The OLED may emit light having certain luminance which corresponds to a level of a current supplied from the driving transistor.

When the scan pulse is supplied to the gate line GL, the pixel driver may control an amount of current supplied to the OLED according to a data voltage supplied to the data line DL.

To this end, the driving transistor may be connected between the first power source and the OLED, and the switching transistor may be connected to the driving transistor, the data line DL, and the gate line GL.

The timing controller 400 outputs a gate control signal GCS for controlling the gate driver 200 and a data control signal DCS for controlling the data driver 300 by using a vertical sync signal, a horizontal sync signal, and a clock which are supplied from an external system (not shown). The timing controller 400 samples input image data received from the external system, realigns the sampled image data, and supplies realigned digital image data to the data driver 300.

The data driver 300 converts the image data, input from the timing controller 400, into analog data voltages, and respectively supplies data voltages of one horizontal line to the data lines at every one horizontal period where the scan pulse is supplied to a corresponding gate line. That is, the data driver 300 converts the image data into the data voltages by using gamma voltages supplied from a gamma voltage generator (not shown), and respectively outputs the data voltages to the data lines.

The gate driver 200 sequentially supplies the scan pulse to the gate lines GL1 to GLg of the panel 100 in response to the gate control signal input from the timing controller 400. Therefore, a plurality of switching transistors which are respectively formed in a plurality of sub-pixels 110 on a corresponding horizontal line to which the scan pulse is applied are turned on, and an image may be output to each of a plurality of the pixels 110. The gate driver 200 may be provided independently from the panel 100, and may be configured in a type which is connected to the panel 100 by various manners. However, the gate driver 200 may be configured in a gate-in panel (GIP) type which is equipped in the panel 100, where the gate driver is integrated into the panel. A signal for turning off the switching transistors is referred to as a turn-off signal. A generic name for the turn-off signal and the scan pulse is a scan signal. For example, the switching transistor is turned on or off according to the scan signal.

Moreover, hereinabove, it has been described that the data driver 300, the gate driver 200, and the timing controller 400 are separately provided, but at least one selected from the data driver 300 and the gate driver 200 may be provided as one body with the timing controller 400. Hereinafter, also, a generic name for the gate driver 200, the data driver 300, and the timing controller 400 is a panel driver.

Figure 4:
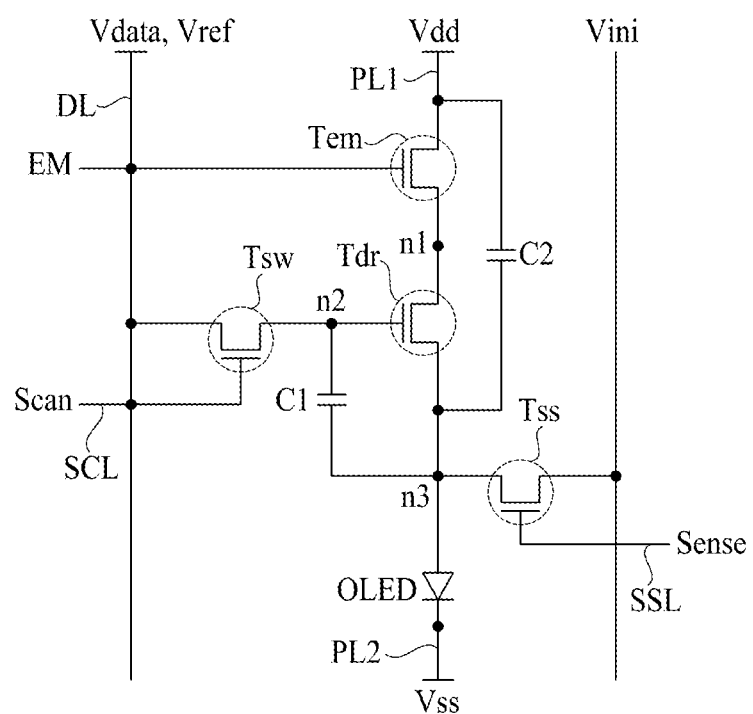
FIG. 4 is a circuit diagram for describing a pixel structure of a display panel according to an embodiment of the present invention.

FIG. 4 is a circuit diagram for describing a pixel structure of a display panel according to an embodiment of the present invention.

Referring to FIG. 4, the pixel P may include an organic light-emitting diode OLED, a driving transistor Tdr, a switching transistor Tsw, a sensing transistor Tss, an emission transistor Tem, and a plurality of capacitors C1 and C2. Each of the transistors Tdr, Tsw, Tss and Tem may be a thin film transistor (TFT or transistor). Also, each of the transistors may be an N-type TFT and may be an amorphous silicon (a-Si) TFT, a poly-Si TFT, an oxide TFT, a low temperature poly silicon (LTPS) TFT, or an organic TFT.

The organic light-emitting diode OLED may be connected to a first driving power line PL1, through which a first voltage Vdd is supplied, and a second driving power line PL2 through which a second voltage Vss is supplied. The organic light-emitting diode OLED may include an emission layer that is formed between an anode and a cathode thereof. The anode may be connected to a first electrode (for example, a source) of the driving transistor. The emission layer may include a hole transport layer, an organic emission layer, an electron transport layer, a hole injection layer, and an electron injection layer.

The organic light-emitting diode OLED may emit light at a brightness, corresponding to an amount of current which flows from a first driving power line PL1 to a second driving power line PL2, according to driving of the driving transistor Tdr.

The driving transistor Tdr may be connected between the first driving power line PL1 and the first electrode (for example, the anode) of the organic light-emitting diode OLED and may control an amount of current, which flows to the organic light-emitting diode OLED, according to a gate-source voltage (that is, a voltage-difference between a voltage supplied to a gate electrode of a TFT and a voltage supplied to a source electrode of the TFT) of driving transistor Tdr.

The switching transistor Tsw may be turned on by the scan pulse supplied through a scan control line SCL and may supply a data voltage Vdata, supplied through the data line DL, to a second node n2 connected to a gate of the driving transistor Tdr.

The sensing transistor Tss may be turned on by a control signal supplied through a sensing control line SSL and may supply an initialization voltage Vini to a third node.

The emission transistor Tem may be turned on by an emission signal EM supplied through an emission signal line and may supply the first driving voltage Vdd, supplied through the first driving power line PL1, to a first node n1.

The first capacitor C1 may sense a threshold voltage of the driving transistor during a threshold voltage sensing period, and during an image display period, the first capacitor C1 may store the data voltage.

The second capacitor C2 increases an efficiency of the data voltage during the image display period, and during an emission period, the second capacitor C2 enhances a holding characteristic.

A bottom shield metal (BSM) may be formed under the driving transistor Tdr, the switching transistor Tsw, or the sensing transistor Tss and prevents device characteristics (for example, a threshold voltage or on/off voltage) of the driving transistor Tdr, the switching transistor Tsw, or the sensing transistor Tss from being changed by charging of the plastic substrate. For example, the bottom shield metal prevents a threshold voltage of a transistor from being randomly shifted for each pixel, thereby preventing non-uniform luminance between pixels.

The bottom shield metal prevents a TFT from being physically damaged during a release operation of releasing a glass carrier while manufacturing a flexible TFT substrate.

To provide an additional description, the bottom shield metal may not be formed under active layers of all the transistors applied to the TFT substrate according to an embodiment of the present invention.

For example, the bottom shield metal is necessarily formed under an active layer of the driving transistor Tdr, and the bottom shield metal may be formed or not under active layers of the other transistors. For example, even when a device characteristic (for example, a threshold voltage) of the emission transistor Tem, the switching transistor Tsw, or the sensing transistor Tss (the collective name for the emission transistor Tem, the switching transistor Tsw and the sensing transistor Tss is the 'transistors for sensing') is changed by a back channel phenomenon, a degree of change in a device characteristic (for example, a threshold voltage) of each of the transistors is smaller than a degree of change in a device characteristic (for example, a threshold voltage) of the driving transistor Tdr. However, when it is determined that the degree of change in a device characteristic of the emission transistor Tem, the switching transistor Tsw, or the sensing transistor Tss is high enough to affect a characteristic of the TFT substrate, the bottom shield metal may be formed under the other transistors.

The bottom shield metal corresponding to the driving transistor Tdr may be connected to one of electrodes (e.g. terminals) of the driving transistor Tdr, or the other electrode, thereby increasing a capacitance.

The bottom shield metal corresponding to the active layers of the transistors (for example, transistors for switching such as the switching transistor Tsw and the emission transistor Tem) other than the driving transistor Tdr may be formed or not on a lower substrate.

Moreover, the bottom shield metal may be formed under active layers of various kinds of transistors which are formed in a non-display area of the flexible TFT substrate, in addition to the transistors formed in the pixel.

For example, when the gate driver 200 is provided in the non-display area by using the GIP type, the bottom shield metal may be formed under active layers of various transistors configuring the gate driver 200.

Moreover, various transistors for an auto probe test may be provided in a pad part in the non-display area, or an electrostatic discharge (ESD) circuit and a multiplexer (MUX) may be provided in the pad part. In this case, the bottom shield metal may be formed under active layers of transistors configuring the elements.

Moreover, when a bottom shield metal corresponding to a transistor for switching is formed on the TFT substrate, the bottom shield metal may be floated or may be connected to one electrode formed on the TFT substrate. In the latter, the bottom shield metal may be connected to one of a plurality of electrodes configuring the transistor for switching which corresponds to the bottom shield metal.

For example, a bottom shield metal corresponding to the switching transistor Tsw may be floated. However, a bottom shield metal under the switching transistor Tsw may be connected to one of a plurality of electrodes formed on the TFT substrate, and particularly, may be connected to a gate of the switching transistor Tsw.

Moreover, when a bottom shield metal is formed under active layers of transistors configuring various elements which are provided in the non-display area, the bottom shield metal may be floated or may be connected to one electrode formed on the TFT substrate. In the latter, the bottom shield metal may be connected to one of a plurality of electrodes configuring a transistor which corresponds to the bottom shield metal.

Moreover, a plurality of bottom shield metals formed for respective transistors may be formed on the same layer or different layers. Also, the bottom shield metals may be formed of the same material or different materials. Also, the bottom shield metals may be formed of the same material (for example, molybdenum (Mo)) as that of a gate configuring each of the transistors.

Figure 5A:
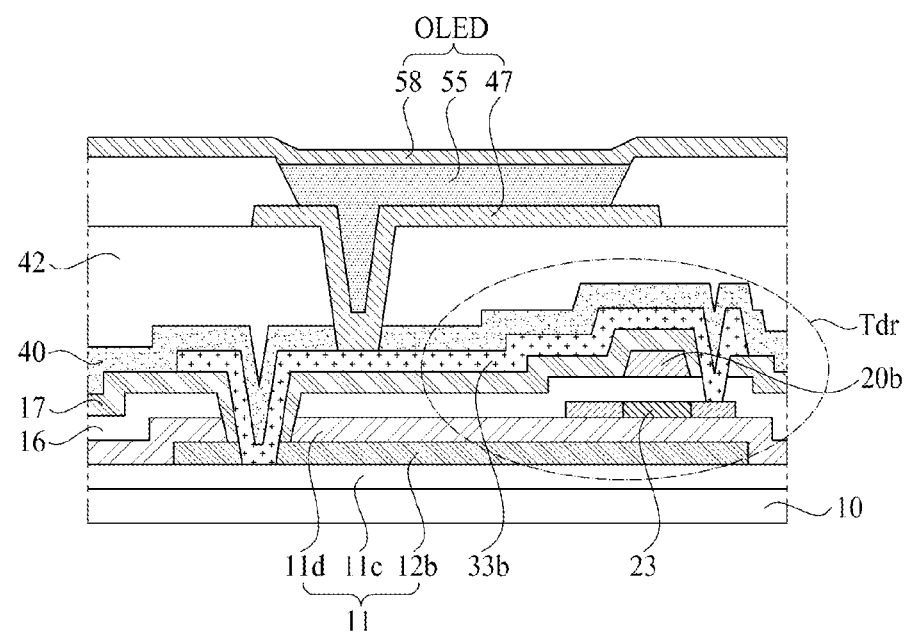
FIG. 5A is a cross-sectional view illustrating a driving transistor of one pixel of a display panel to which a TFT substrate according to a first embodiment of the present invention is applied.
Figure 5B:
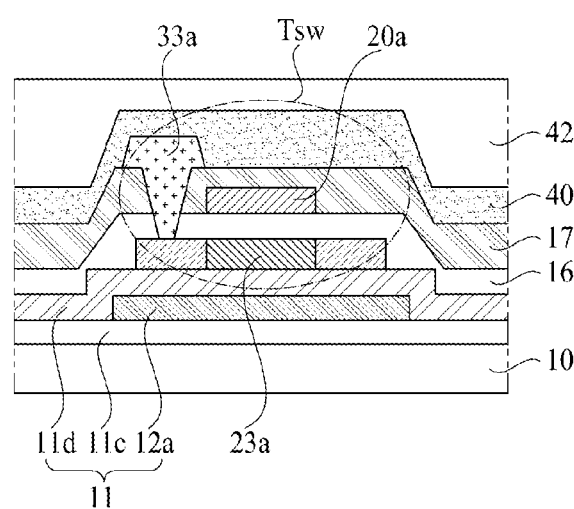
FIG. 5B is a cross-sectional view illustrating a switching transistor of the one pixel of the display panel to which the TFT substrate according to the first embodiment of the present invention is applied.

FIG. 5A is a cross-sectional view illustrating a driving transistor of one pixel of a display panel to which a TFT substrate according to a first embodiment of the present invention is applied. FIG. 5B is a cross-sectional view illustrating a switching transistor of the one pixel of the display panel to which the TFT substrate according to the first embodiment of the present invention is applied.

Referring to FIGS. 4, 5A, and 5B, the display panel to which the TFT substrate according to the first embodiment of the present invention is applied may include a lower substrate 10 formed of a polymer material such as a plastic and a buffer 11 formed on the lower substrate 10. Also, the display panel may include a first active layer 23a, which is insulated from a first BSM 12a configuring the buffer 11 and overlaps the first BSM 12a, and a switching transistor Tsw that is formed on the buffer 11 and is driven according to a scan signal supplied through a gate line GL which is formed on the lower substrate 10. Also, the display panel may include a second active layer 23b, which is insulated from a second BSM 12b configuring the buffer 11 and overlaps the second BSM 12b, and a driving transistor Tdr that is formed on the buffer 11 and is driven according to a data voltage Vdata supplied through the switching transistor Tsw from a data line DL which is formed on the lower substrate 10. Also, the display panel may include a planarization layer 42, which is formed on the switching transistor Tsw and the driving transistor Tdr, and an organic light-emitting diode (OLED) which is formed on the planarization layer 42 and is connected to a second source electrode 33b of the driving transistor Tdr.

The lower substrate 10 may be located on an auxiliary substrate (not shown) that includes a base substrate such as a glass carrier (not shown) and a sacrificial layer (not shown) during the manufacturing process, and a material of the lower substrate 10 may be plastic such as polyimide (PI). The auxiliary substrate supporting the lower substrate and the other elements in the TFT substrate may be released after forming TFT substrate.

The buffer 11 may include a multi-buffer 11c which is formed on the lower substrate 10, the first and second BSMs 12a and 12b which are formed on the multi-buffer 11c, and an active buffer 11d which is formed on the first and second BSMs 12a and 12b. However, the present embodiment is not limited thereto. Therefore, the buffer 11 may include the first and second BSMs 12a and 12b which are formed on the lower substrate 10, the multi-buffer 11c which is formed on the first and second BSMs 12a and 12b, and the active buffer 11d which is formed on the multi-buffer 11c.

The multi-buffer 11c may perform an encapsulation function. That is, since plastic is used as the lower substrate 10, the multi-buffer 11c may be used for preventing penetration of moisture. Therefore, the multi-buffer 11c may be formed of at least one layer containing an organic material for covering unwanted particles or holes, such as resin, and at least one layer containing inorganic material such as $Al_2O_3$ or $SiO_2$ for moisture-proofing by dense barrier.

The active buffer 11d is for protecting an active layer of a transistor formed on the buffer 11 and prevents various defects from being input from the lower substrate 10. The active buffer 11d may be formed of a-Si.

In addition, the buffer 11 may include the first and second BSMs 12a and 12b and a plurality of buffer layers. The first and second BSMs 12a and 12b and the plurality of buffer layers may be formed in various structures.

The first and the second active layers 23a and 23b, a gate insulation layer 16, a first and a second gate 20a, 20b, an interlayer dielectric 17 may be formed on the buffer 11 of the TFT substrate. In other words, the driving transistor Tdr, and the switching transistor Tsw may be formed on the buffer 11 of the TFT substrate. The driving transistor Tdr may include a second source electrode 33b and a second drain electrode (not shown), and the switching transistor Tsw may include a first source electrode 33a and a first drain electrode (not shown).

A passivation layer 40 and the planarization layer 42 may be sequentially formed on the driving transistor Tdr and the switching transistor Tsw.

The organic light-emitting diode (OLED) connected to the second source electrode 33b of the driving transistor Tdr may be formed on the planarization layer 42.

As briefly mentioned above, the transistors of the display panel 100 can be provided with a bottom shield metal (BSM) placed thereunder to minimize the back-channel phenomenon caused by the charges trapped in the lower substrate 10. However, the potential of the BSM under the transistors may change during operation of the display panel 100 and affect the threshold voltage (Vth) of the transistor. If the BSM is in a floating state, the amount of shift in the Vth of the transistors in each of pixel circuits can vary, and cause unwanted visual defects (e.g., luminance variation). Accordingly, in some embodiments, the BSM can be connected to one of the electrodes of the transistor placed thereon.

For instance, the BSM can be connected to the source electrode or the drain electrode of the transistor. In such cases, equipotential is formed between the BSM and the electrode of the transistor connected to the BSM. Effect on the Vth of the transistor by the BSM can be minimized so long as the voltage difference between the BSM and the electrode connected to the BSM remains lower than the voltage difference between the gate electrode and the source electrode of the transistor (i.e., VGS or gate-source voltage). Thus, the BSM can be connected to either the source or the drain electrode of the transistor so long as the aforementioned relationship is satisfied.

In this regard, it is preferred that the BSM is connected with an electrode applied with a signal that can satisfy the above-mentioned relationship as long as possible during the operation of the display panel 100. In other words, the voltage difference between the BSM and the connected electrode should be maintained equal to or below the VGS for as much duration as possible by connecting the BSM to an electrode supplied with a steady voltage.

Further, the voltage difference between the BSM and the connected electrode is preferred to be equal to or higher than 0V so that the Vth of the transistor does not shift in the opposite direction. That is, a positive shift of the Vth can be suppressed in the N-Type transistor and a negative shift of the Vth can be suppressed in the P-Type transistor.

Simply put, it would be the best if the voltage difference between the BSM and the connected electrode is 0V. In this case, the BSM will not create a back-channel in the transistor.

As such, in some embodiments, the second BSM 12b corresponding to the driving transistor Tdr may be connected to the second source electrode 33b (or, it is possible to connected to the second drain electrode). In such cases, the same voltage is provided to the second BSM 12b and the second source electrode 33b (or, it is possible to connected to the second drain electrode) of the driving transistor Tdr, making the voltage difference between the two equal to 0V. Accordingly, the second BSM 12b can be configured not to create a back-channel in the driving transistor Tdr, while suppressing the Vth shift of the driving transistor Tdr by the charges trapped in the lower substrate 10.

Although FIG. 5A illustrates the second BSM 12b being connected to the second source electrode 33b of the driving transistor Tdr, in some embodiments, the BSM provided under the sensing transistor Tss may be connected to the source electrode of the sensing transistor Tss, which is provided with the initialization voltage Vini. In such a setting, the BSM under the sensing transistor Tss can provide the similar advantages as the configuration of the second BSM 12b connected to the second source electrode 33b of the driving transistor Tdr described above. Further, it should be appreciated that some of the transistors implementing the driving circuits (e.g., transistors of the gate-in-panel driving circuit) of the display panel 100 can also be configured in the similar way as the second BSM 12b under the driving transistor Tdr described above.

In some embodiments, the BSM can be connected to the gate electrode of a transistor placed thereon. In such cases, the same voltage is simultaneously applied to the BSM and the gate electrode, and thus, the BSM serves as a secondary gate electrode of the transistor. In this configuration, an extra channel region can be provided on the surface of the active layer toward the BSM. This would increase the mobility of the transistor without having to increase the size of the transistor. Accordingly, such a configuration is particularly useful for transistors requiring high mobility, for example the buffer transistors, as it allows the transistor to have the desired mobility with a reduced size.

In way of example, the first BSM 12a placed under the switching transistor Tsw may be connected to the first gate 20a of the switching transistor Tsw. Accordingly, the first BSM 12a suppresses the Vth shift of the switching transistor Tsw by the charges trapped in the lower substrate 10, and also acts as the secondary gate electrode that provides an extra channel in the switching transistor Tsw. It should be appreciated that other transistors for switching (e.g., the emission transistor Tem, the sensing transistor Tss) in the pixel circuits and/or the transistors in the driving circuits (e.g., GIP, data driver, touch driver, etc.) of the display panel 100 can be configured in the similar way as the configuration of the first BSM 12a under the switching transistor Tsw described above.

The OLED may be formed on the planarization layer 42 and may include a first electrode 47 connected to the second source electrode 33b, an emission layer 55 formed on the first electrode 47, and a second electrode 58 formed on the emission layer 55.

As illustrated in FIGS. 5A and 5B, in the TFT substrate, the second BSM 12b may be connected to the first electrode 47 of the OLED through the second source electrode 33b of the driving transistor Tdr.

The TFT substrate may be sealed for preventing penetration of moisture and protecting the OLED from the outside.

The TFT substrate may further include a sensing transistor Tss, which senses a threshold voltage "Vth" of the driving transistor Tdr, and an emission transistor Tem that controls an emission period of the OLED. In this case, a third active layer (not shown), which is an active layer of the sensing transistor Tss, a third gate (not shown), which is a gate of the sensing transistor Tss and a third BSM (not shown) under the sensing transistor Tss can be located within the buffer 11. The third BSM, which may be insulated from the third active layer, is arranged to overlap the third active layer.

The BSMs under the sensing transistor Tss and the emission transistor Tem may also be arranged in the same manner as that of the third BSM under the switching transistor Tsw illustrated in FIG. 5B.

Figure 6:
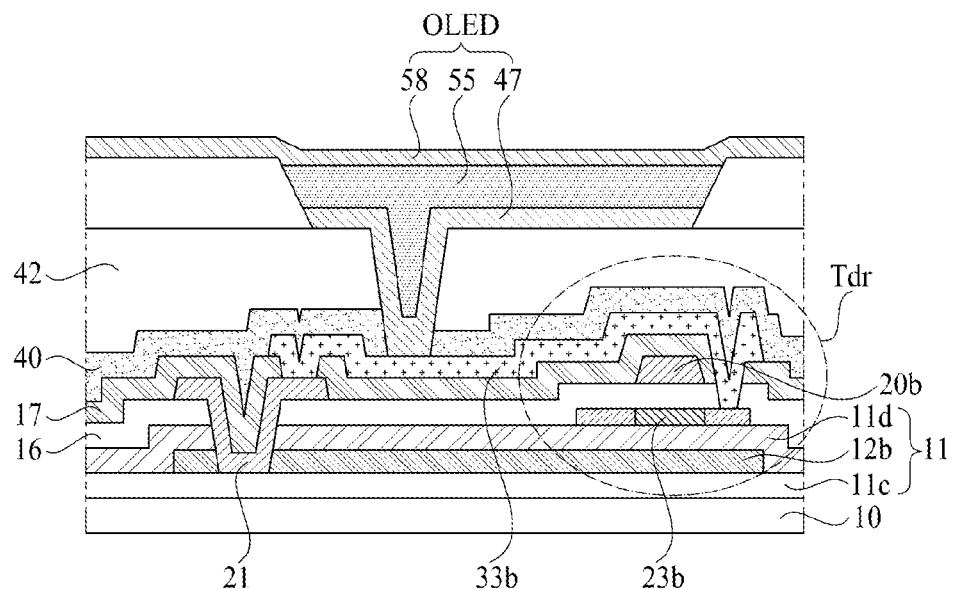
FIG. 6 is a cross-sectional view illustrating a driving transistor of one pixel of a display panel to which a TFT substrate according to a second embodiment of the present invention is applied.

FIG. 6 is a cross-sectional view illustrating a driving transistor in a pixel circuit according to a second exemplary embodiment of the present invention.

As shown in FIG. 6, the second BSM 12b applied to the TFT substrate may be connected to the second source electrode 33b of the driving transistor Tdr and the first electrode 47 of the OLED through a connection electrode 21 formed on a layer where the second gate 20b of the driving transistor Tdr is formed.

Except for the above-described features, other elements of the display panel 100 may be configured in the same way to the other embodiments described in the present disclosure. That is, except for a connection structure of the second BSM 12b and the second source electrode 33b, a structure of the TFT substrate depicted in FIG. 6 may be the same as that of the TFT substrate according to the other embodiments of the present invention.

The buffer 11 provided on the TFT substrate may include a multi-buffer 11c which is formed on the lower substrate 10, the second BSM 12b which is formed on the multi-buffer 11c, and an active buffer 11d which is formed on the second BSM 12b. However, the present embodiment is not limited thereto. Therefore, the second BSM 12b may be formed on the lower substrate 10, and the multi-buffer 11c may be formed on the second BSM 12b. The active buffer 11d can be formed on the multi-buffer 11c.

As illustrated in FIG. 6, the second active layer 23b, the gate insulation layer 16, the second gate 20b, the interlayer dielectric 17 may be formed on the buffer 11 of the TFT substrate. In other words, the driving transistor Tdr may be formed on the buffer 11 of the TFT substrate. The second BSM 12b may be connected to the second source electrode 33b of the driving transistor Tdr through the connection electrode 21 formed on the gate insulation layer 16. In other words, the connection electrode 21 is formed at the same layer where the second gate 20b of the driving transistor Tdr is positioned, and the connection electrode 21 is connected to the second BSM 12b via at least one contact hole in the gate insulation layer 16, and the second source electrode 33b is connected to the connection electrode 21 via at least one contact hole in the interlayer dielectric 17. Also, the first electrode 47 of the OLED may be connected to the second source electrode 33b of via at least one contact hole in a passivation layer 40. Therefore, the second BSM 12b may be connected to the first electrode 47 of the OLED through the connection electrode 21.

The passivation layer 40 and a planarization layer 42 covering the passivation layer 40 may be sequentially formed on the driving transistor Tdr.

An OLED connected to the second source electrode 33b of the driving transistor Tdr may be formed on the planarization layer 42.

The TFT substrate may be sealed for preventing penetration of moisture and protecting the OLED from the outside.

As described above, the second BSM 12b may be connected to the first driving electrode 47 of the OLED through the connection electrode 21 formed on a layer where the second gate 20b is formed.

Figure 7:
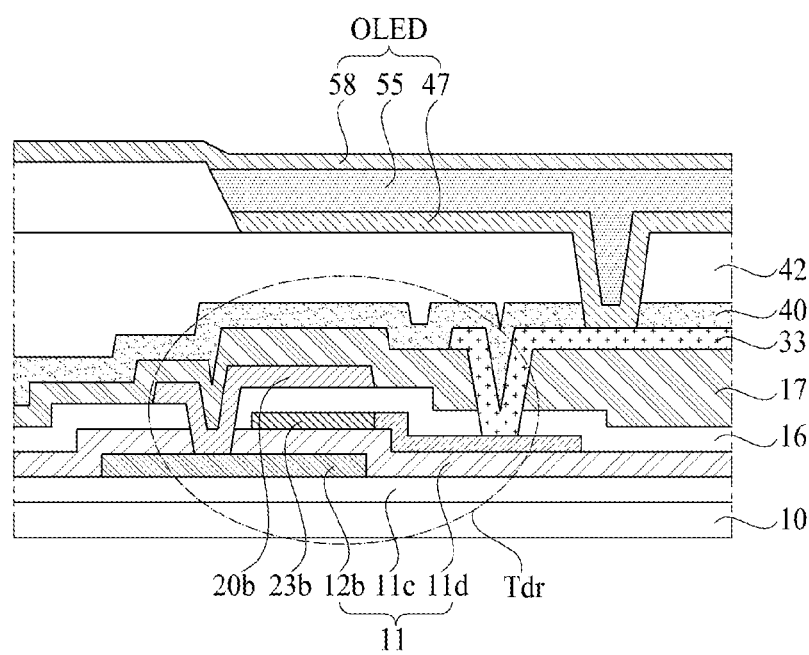
FIG. 7 is a cross-sectional view illustrating a driving transistor of one pixel of a display panel to which a TFT substrate according to a third embodiment of the present invention is applied.

FIG. 7 illustrates a cross-sectional view of a driving transistor in a pixel circuit on a TFT substrate of a display panel according to a third exemplary embodiment of the present invention.

As shown in FIG. 7, the second BSM 12b in the TFT substrate may be connected to the second gate 20b of the driving transistor Tdr. Other elements of the display panel may be configured in the similar way as any other embodiments of the present disclosure.

Referring to FIG. 7, the TFT substrate includes a lower substrate 10, a buffer 11, a second active layer 23b which is insulated from a second BSM 12b configuring the buffer 11 and overlaps the second BSM 12b, a driving transistor Tdr that is formed on the buffer 11 and is driven according to a data voltage Vdata supplied through the switching transistor Tsw from a data line DL which is formed on the lower substrate 10, a planarization layer 42 which is formed on the driving transistor Tdr, and an OLED which is formed on the planarization layer 42 and is connected to a second source electrode 33b of the driving transistor Tdr.

The buffer 11 may include a multi-buffer 11c, which is formed on the lower substrate 10, the second BSM 12b which is formed on the multi-buffer 11c, and an active buffer 11d which is formed on the second BSM 12b.

The second active layer 23b, the gate insulation layer 16, the second gate 20b, the interlayer dielectric 17 may be formed on the buffer 11 of the TFT substrate. In other words, the driving transistor Tdr may be formed on the buffer 11 of the TFT substrate.

The second BSM 12b may be connected to the second second gate 20b configuring the driving transistor Tdr.

Therefore, a potential of the second BSM 12b is maintained the same voltage of the second gate 20b configuring the driving transistor Tdr without any change-fluctuation. Accordingly, a change in a characteristic of each of peripheral elements of the second BSM 12b is reduced as described above.

Therefore, when the TFT substrate is driven, the second BSM 12b is maintained at the same voltage as a voltage at the second gate 20bb. Accordingly, a voltage of the second BSM 12b is not affected by an external voltage, and thus, a threshold voltage of the driving transistor Tdr is prevented from being shifted due to an unintended back-channel phenomenon which is caused by the lower substrate 10 and the sacrificial layer (not shown).

Moreover, since the second BSM 12b is under the second active layer 23b, the second active layer 23b of the driving transistor Tdr formed on the lower substrate 10 is prevented from being damaged by a laser which is irradiated in an operation of detaching the auxiliary substrate (not shown) from the lower substrate 10.

The second BSM 12b may be connected to the second source electrode 33b of the driving transistor Tdr and may be connected to the second gate 20b of the driving transistor Tdr. Also, when the second BSM 12b is connected to the second source electrode 33b, the second BSM 12b may be connected to the second source electrode 33b in a type illustrated in FIG. 5A or may be connected to the second source electrode 33b in a type illustrated in FIG. 6 depending on a stacked structure of the TFT substrate or the kinds of materials which are stacked on the TFT substrate.

Moreover, the second BSM 12b may be connected to another electrode instead of the second source electrode 33b and the second gate 20b, or may not be connected to any electrode.

Hereinafter, a method of manufacturing a TFT substrate according to an embodiment of the present invention will be described in detail with reference to FIGS. 4 to 8E.

FIGS. 8A to 8E are cross-sectional views for describing a method of manufacturing a display panel including a TFT substrate, according to an embodiment of the present invention and illustrates a cross-sectional surface of the driving transistor Tdr. Particularly, FIGS. 8A to 8E are cross-sectional views for describing a method of manufacturing the display panel including the TFT substrate according to the first embodiment of the present invention. However, methods to be described below may be applied to the manufacturing of the display panel including the TFT substrate according to the second and third embodiments of the present invention.

Referring to FIGS. 8A to 8D, the display panel including the TFT substrate according to the first embodiment of the present invention may be manufactured by performing: an operation of forming the lower substrate 10 with plastic on the auxiliary substrate A; an operation of forming the buffer 11, which includes the first BSM (not shown) and the second BSM 12b, on the lower substrate 10; an operation of forming, on the buffer 11, the switching transistor Tsw including the first active layer (not shown) which is insulated from the first BSM (not shown) and overlaps the first BSM (not shown) and the driving transistor Tdr including the second active layer 23b which is insulated from the second BSM 12b and overlaps the second BSM1 12b; an operation of forming the planarization layer 42 on the driving transistor Tdr; an operation of forming, on the planarization layer 42, the OLED connected to the second source electrode 33b of the driving transistor Tdr that is driven according to a data voltage supplied through the switching transistor Tsw; and an operation of detaching the auxiliary substrate A from the lower substrate 10 by performing a laser release process.

First, as illustrated in FIG. 8, in the operation of forming the lower substrate 10 with plastic on the auxiliary substrate A, a sacrificial layer 85 may be formed on a glass carrier 80, and then, the lower substrate 10 formed of plastic may be formed on the sacrificial layer 85. The lower substrate 10 may be formed of one selected from polyethersulphone (PES), polyacrylate (PAR), polyetherimide (PEI), polyethyelenen napthalate (PEN), polyethyelene terephthalate (PET), polyphenylene sulfide (PPS), polyallylate, polyimide, polycarbonate (PC), cellulous tree acetate (TAC), and cellulose acetate propionate (CAP).

The lower substrate 10 may be formed by, for example, a spin coating process. To provide a more detailed description, a liquid material containing one of the above-described materials may be disposed on the sacrificial layer 85, and then, by rotating the glass carrier 80 at a high speed, the lower substrate 10 which has good thickness uniformity and is thin (thin film) may be formed.

Moreover, the lower substrate 10 may also be formed by a roll coating process and a slit coating process. Such two processes reduce thickness uniformity compared to the spin coating process, but are high in production efficiency.

Figure 8A:
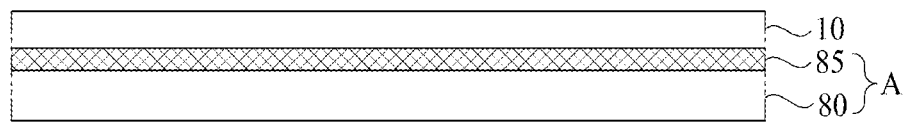
FIGS. 8A to 8E are cross-sectional views for describing a method of manufacturing a display panel including a TFT substrate, according to the first exemplary embodiment of the present invention.
Figure 8B:
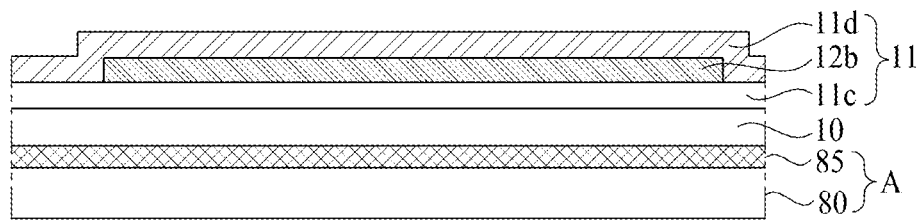

Subsequently, as illustrated in FIG. 8B, the buffer 11 is formed on the first BSM (not shown) and the second BSM 12b may be formed on the lower substrate 10. The buffer 11 may include the multi-buffer 11c which is formed on the lower substrate 10, the first BSM (not shown) and the second BSM 12b which are formed on the multi-buffer 11c, and the active buffer 11d which is formed on the first BSM (not shown) and the second BSM 12b. However, the present embodiment is not limited thereto.

Figure 8C:
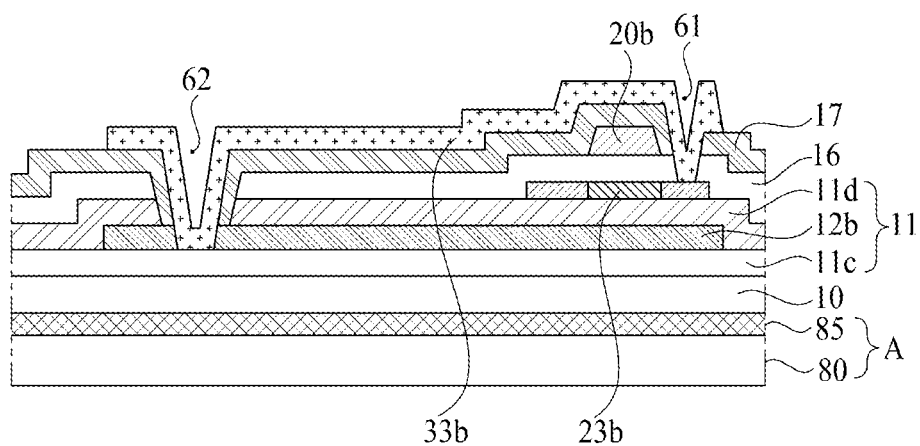

Subsequently, as illustrated in FIG. 8C, a switching transistor (not shown) including a first active layer (not shown) which is insulated from the first BSM (not shown) and overlaps the first BSM (not shown) and the driving transistor Tdr including the second active layer 23b which is insulated from the second BSM 12b and overlaps the second BSM 12b may be formed.

The operation of forming the driving transistor Tdr illustrated in FIG. 5A may include an operation of forming the second active layer 23b on the buffer 11; an operation of forming a gate insulation layer 16 on the second active layer 23b; an operation of forming a second gate 20b on the gate insulation layer 16; an operation of forming an interlayer dielectric 17 on the second gate 20b; an operation of forming, on the interlayer dielectric 17, a contact hole 61 which exposes the second source electrode 33b connected to the second active layer 23b and a contact hole 62 which exposes the second BSM 12b; and an operation of forming the second source electrode 33b and a second drain electrode (not shown) on the interlayer dielectric 17.

Moreover, the second BSM 12b may be connected to one of metals forming the driving transistor Tdr, metals connected to the driving transistor Tdr, metals forming the OLED, and metals for supplying power necessary for emission of light from the OLED.

The operation of forming the switching transistor Tsw illustrated in FIG. 5B may include an operation of forming the first active layer 23a on the buffer 11, an operation of forming a gate insulation layer 16 on the first active layer 23a, an operation of forming a first gate 20a on the gate insulation layer 16, an operation of forming an interlayer dielectric layer 17 on the first gate 20a; and an operation of forming, on the interlayer dielectric 17, a first source electrode 33a and a first drain electrode (not shown) which configure the switching transistor Tsw.

Here, the second BSM 12b of the driving transistor Tdr may be connected to the second source electrode 33b of the driving transistor Tdr through the contact hole. Also, the first BSM 12a of the switching transistor Tsw may be floated.

Moreover, the method of manufacturing the display panel including the TFT substrate may further include an operation of a sensing transistor Tss on the buffer 11; and an operation of forming, on the buffer 11, an emission transistor Tem for controlling an emission period of the OLED. The sensing transistor may include a third active layer (not shown) that is insulated from a third BSM (not shown) configuring the buffer 11 and overlaps the third BSM (not shown), and may sense a threshold voltage of the driving transistor Tdr.

Figure 8D:
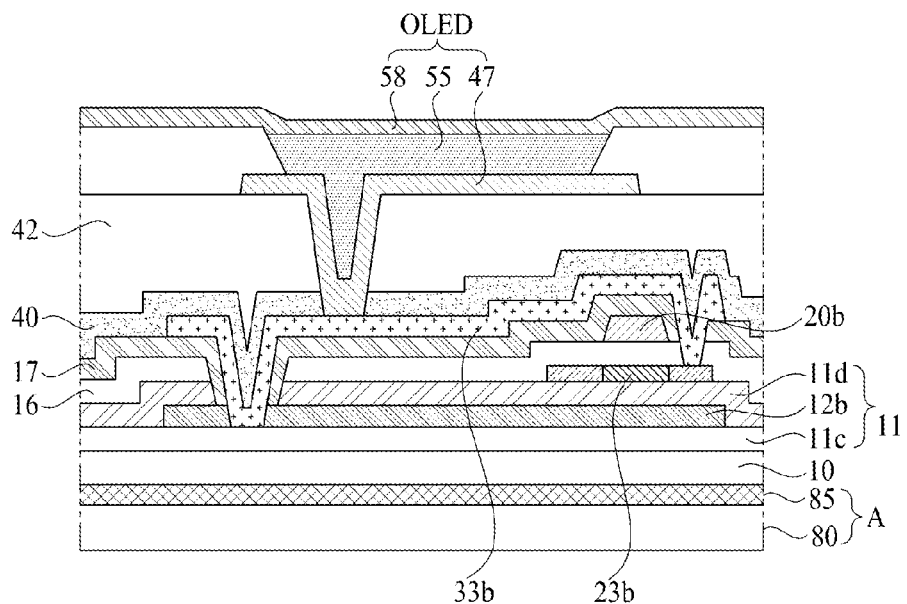

Subsequently, as illustrated in FIG. 8D, a passivation layer 40 and a planarization layer 42 may be sequentially formed on the driving transistor Tdr. Also, the OLED connected to the second source electrode 33b of the driving transistor Tdr may be formed on the planarization layer 42.

Although not shown, the passivation layer 40 and the planarization layer 42 may also be sequentially formed on the switching transistor Tsw.

Figure 8E:
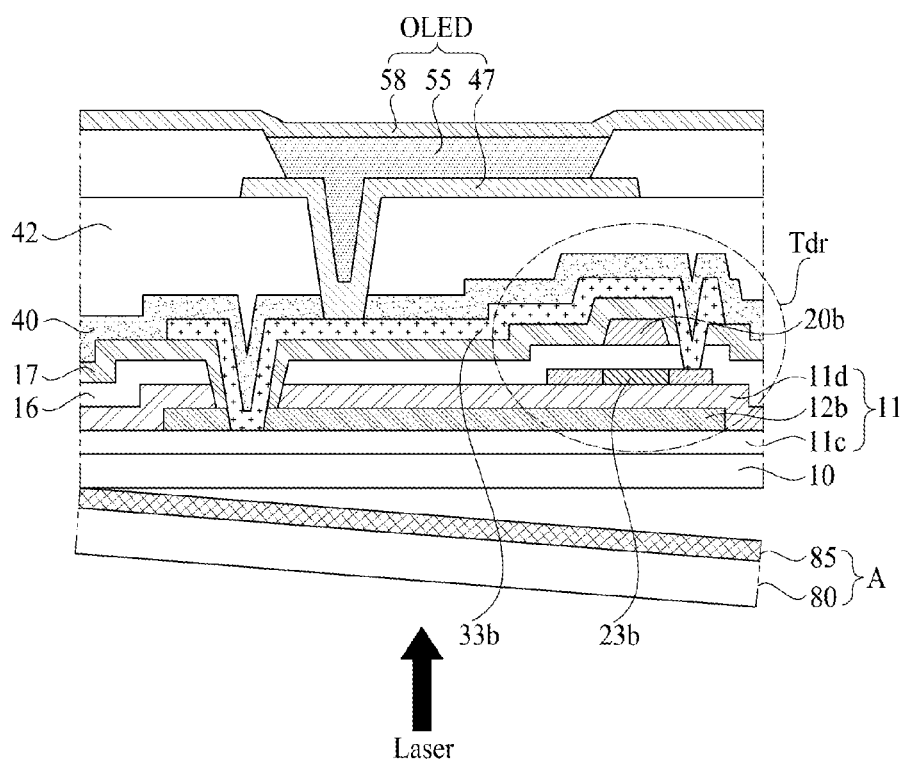

Finally, as illustrated in FIG. 8E, the auxiliary substrate A may be detached from the lower substrate 10 by performing the laser release process.

Through the above-described operations, the display panel including the TFT substrate may be manufactured. As described above, among the elements illustrated in FIG. 8, elements other than the second electrode 58 and the emission layer 55 may configure the TFT substrate. The display panel may include the TFT substrate, the second electrode 58, and the emission layer 55. In this case, the display panel may further include a plurality of elements that seal the second electrode 58 and the emission layer 55.

The TFT substrate according to the second and third embodiments of the present invention may be manufactured by the same method as the method of manufacturing the display panel including the TFT substrate according to the first embodiment of the present invention, except for a method of connecting the BSM to one of electrodes in the TFT or one metal line. Hereinafter, thus, a method of manufacturing the TFT substrate according to the second and third embodiments of the present invention will be briefly described.

For example, in a method of manufacturing the TFT substrate according to the second embodiment of the present invention, the second active layer 23b may be formed on the buffer 11, a gate insulation layer 16 may be formed on the second active layer 23b, a contact hole may be formed to expose the second BSM 12b, a connection electrode 21 and a second gate 20b which are connected to the second BSM 12b may be formed on the gate insulation layer 16, an interlayer dielectric 17 may be formed on the second gate 20b and the connection electrode 21, and a second source electrode 33b and a second drain electrode (not shown) may be formed on the interlayer dielectric 17. In this case, the second source electrode 33b may be connected to the connection electrode 21 through a contact hole which is formed in the interlayer dielectric 17. Therefore, the second source electrode 33b may be connected to the second BSM 12b through the connection electrode 21.

Moreover, in a method of manufacturing the TFT substrate according to the third embodiment of the present invention, the second active layer 23b may be formed on the buffer 11, a gate insulation layer 16 may be formed on the second active layer 23b, a contact hole may be formed in the gate insulation layer 16 to expose the second BSM 12b, a second gate 20b which is connected to the second BSM 12b through the contact hole may be formed on the gate insulation layer 16, an interlayer dielectric 17 may be formed on the second gate 20b, and the second source electrode 33b and the second drain electrode (not shown) of the driving transistor Tdr may be formed on the interlayer dielectric 17.

Figure 9A:
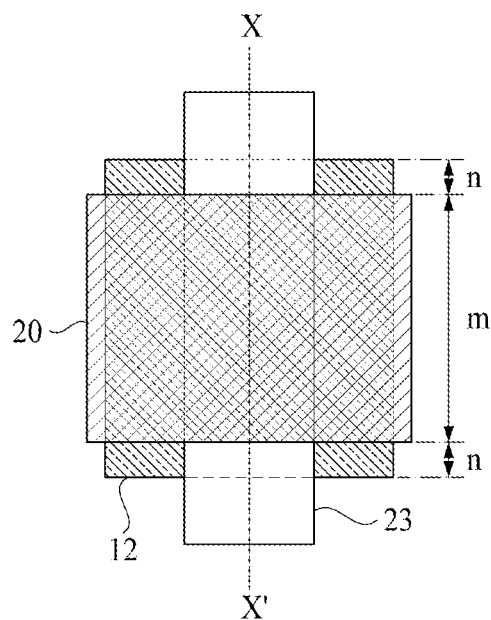
FIGS. 9A to 9C are diagrams illustrating a structure of a transistor applied to a TFT substrate according to an embodiment of the present invention.
Figure 9A:
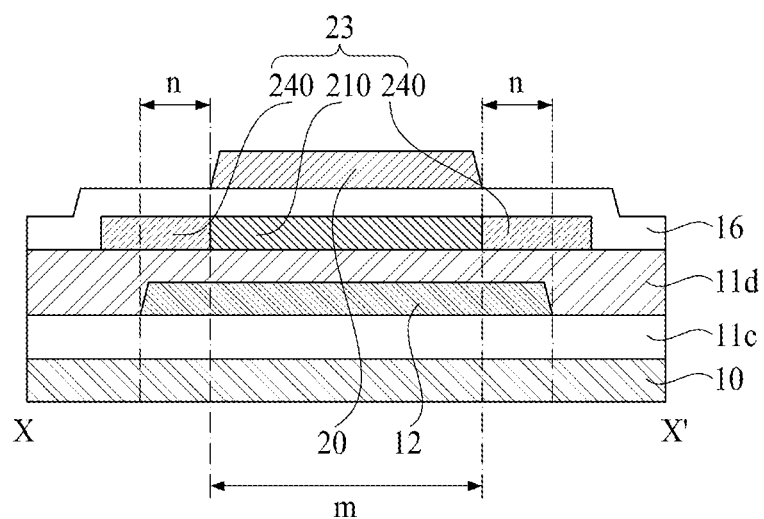
Figure 9B:
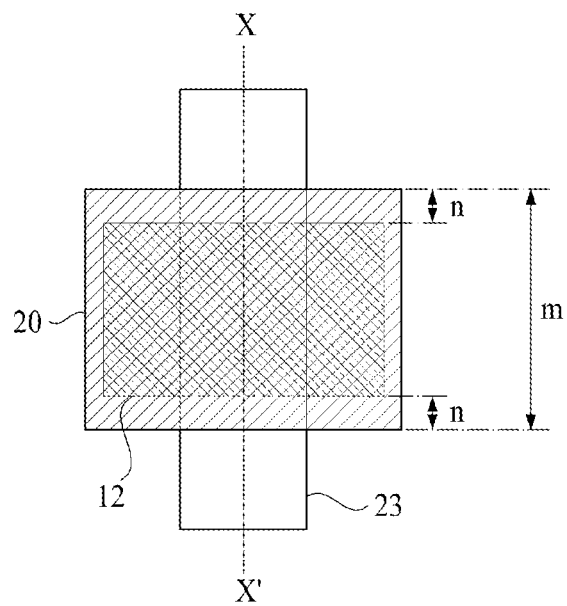
Figure 9B:
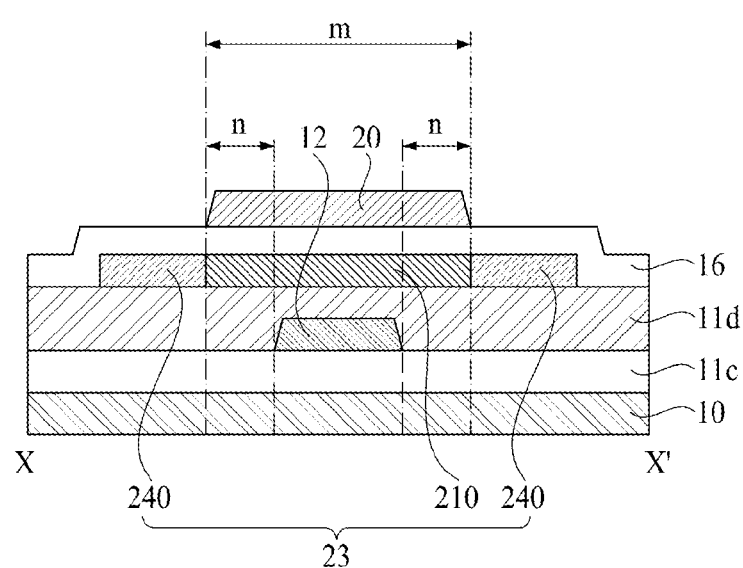
Figure 9C:
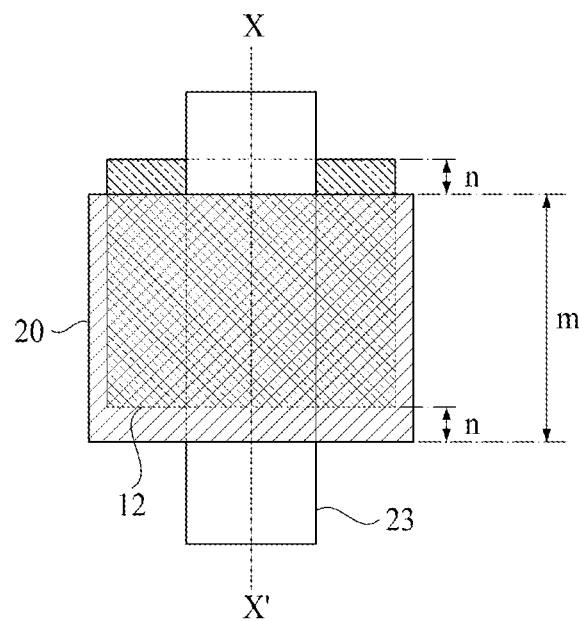
Figure 9C:
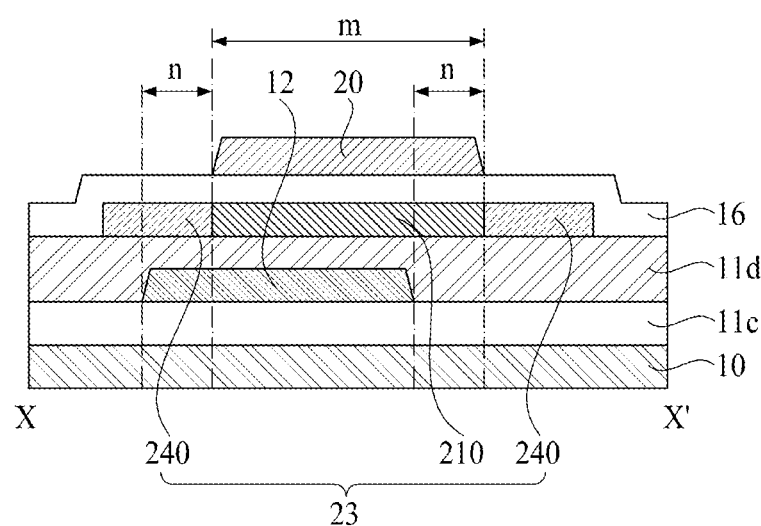

FIGS. 9A to 9C are diagrams illustrating a structure of a transistor applied to a TFT substrate according to a fourth exemplary embodiment of the present invention, and particularly, illustrate elements for describing a length of a gate and a bottom shield metal. Here, a portion (a) of each of FIGS. 9A to 9C is a plan view of a transistor, and a portion (b) of each of FIGS. 9A to 9C is a cross-sectional view of the portion (a) taken along line X-X' perpendicular to a channel length of the TFT.

The bottom shield metal 12 illustrated in FIGS. 9A to 9C may be the first BSM 12a, the second BSM 12b or the third BSM (not shown) in FIGS. 5A to 8E, but is not limited thereto. Therefore, the gate 20 illustrated in FIGS. 9A to 9C may be the second gate 20b of the driving transistor Tdr, the first gate 20a of the switching transistor Tsw or the third gate of the sensing transistor Tss, but is not limited thereto. Also, the active layer 23 illustrated in FIGS. 9A to 9C may be the first active layer 23a of the switching transistor Tsw, the second active layer 23b of the driving transistor Tdr, or the third active layer (not shown) of the sensing transistor Tss, but is not limited thereto.

To provide an additional description, the TFT illustrated in FIGS. 9A to 9C may be one of various kinds of TFTs formed on the TFT substrate, and the BSM may correspond to the TFT thereunder. Therefore, the BSMs illustrated in FIGS. 5A to 8E may be referred to by 12 in FIGS. 9A to 9C, the gates illustrated in FIGS. 5A to 8E may be referred to by 20 in FIGS. 9A to 9C, and the active layers illustrated in FIGS. 5A to 8E may be referred to by 23 in FIGS. 9A to 9C.

Referring to FIGS. 9A to 9C, an active buffer 11d may be formed between the bottom shield metal 12 and the active layer 23, a gate insulation layer 16 may be formed on the active layer 23, and the gate 20 may be formed on the gate insulation layer 16.

In this case, the active layer 23 may include a channel 210 and two doping areas 240 which are formed on both sides of the channel 210. Although not illustrated in a portion (a) and a portion (b) of FIG. 9A, a source electrode and a drain electrode are connected to the two doping areas 240, respectively. The channel 210 of the TFT in between two doping areas 240 is a transfer—path of charges between source and drain electrodes of the TFT, and the length of the channel 210 of the TFT means the length of the transfer—path of charges between source and drain electrode in the active layer 23.

As illustrated in a portion (a) and a portion (b) of FIG. 9A, a width of the bottom shield metal 12 may be than that of the gate 20. The length of the bottom shield metal 12 and the length of the gate 20 are perpendicular to the length of the channel 210. For example, when a length of the gate 20 is m μm, a length of the bottom shield metal 12 may be m+2n μm, and both outer ends of the bottom shield metal 12 along the direction of the length of the channel 210 may further protrude by n μm from an outer end of the gate 20 along the said direction, respectively.

In this case, a width of the bottom shield metal 12 may be narrower than that of the active layer 23. Therefore, the both outer ends of the bottom shield metal 12 along the direction of the length of the channel 210 may be at respective positions corresponding to an outer end of the doping areas 240 along the said direction, respectively.

Therefore, the gate 20 and the active layer 23 may be covered by the bottom shield metal 12, and thus, a driving characteristic of a transistor which includes the gate and the active layer is prevented from being changed.

Therefore, a structure illustrated in FIG. 9A may be applied to the driving transistor Tdr. To provide an additional description, in the structure illustrated in FIG. 9A, since the bottom shield metal 12 is covered by the entire area of the channel 210 which is formed between the gate 20 and the active layer 23, the most stable transistor characteristic is gained. Accordingly, the structure illustrated in FIG. 9A is a structure which is suitable for the use of the driving transistor Tdr which finely controls a current corresponding to a voltage-difference between a voltage of the gate and a voltage of the source electrode in the driving transistor Tdr.

Although not illustrated in FIG. 9A, the length of the channel 210 depends on the one having larger length among the gate 20 and the bottom shield metal 12 when the bottom shield metal 12 is connected to the gate 20. When the bottom shield metal 12 is connected to the gate 20, the bottom shield metal 12 acts as the secondary gate electrode that provides an extra channel in the TFT.

As illustrated in a portion (a) and a portion (b) of FIG. 9B, a width of the bottom shield metal 12 may be narrower than that of the gate 20. For example, when a length of the gate 20 is m μm, a length of the bottom shield metal 12 may be m−2n μm, and both outer ends of the gate 20 along the direction of the length of the channel 210 may further protrude by n μm from an outer end of the bottom shield metal 12 along the said direction, respectively.

A structure illustrated in FIG. 9B may be applied to a case where a leakage current caused by the bottom shield metal 12 largely occurs in a transistor which is formed to have the structure illustrated in FIG. 9A. For example, a leakage current of a transistor having the structure illustrated in FIG. 9B may be lower than that of the transistor having the structure illustrated in FIG. 9A.

Therefore, the structure illustrated in FIG. 9B may be applied to a transistor (for example, the switching transistor Tsw) which is less affected by a leakage current.

To provide an additional description, as illustrated in FIG. 9A, when the bottom shield metal 12 acts as the secondary gate electrode that provides an extra, additional channel, an off current (e.g. a leakage current) increases despite the same TFT size. However, as illustrated in FIG. 9B, when the bottom shield metal 12 is designed smaller than the gate 20, an increase in the off current is minimized. Therefore, the structure illustrated in FIG. 9B is a structure which is suitable for the use of the switching transistor where an on/off current ratio is an important characteristic.

As illustrated in a portion (a) and a portion (b) of FIG. 9C, a width of the bottom shield metal 12 may be formed to be asymmetrical with the gate 20. For example, the bottom shield metal 12 may overlap an outer end of one side of the gate 20 along the direction of the length of the channel 210, but may not overlap an end of the other side of the gate 20. In other words, when a length of the gate 20 is m μm and a length of the bottom shield metal 12 may be m μm, both outer ends of the gate 20 and the bottom shield metal 12 along the direction of the length of the channel 210 may not matched. That is, the bottom shield metal 12 and the gate 20 partially overlap each other along the direction of the length of the channel 210.

To provide an additional description, the bottom shield metal 12 may be formed leaning to at least an outer ends of one side of the gate 20. In this case, a length of the bottom shield metal 12 may be formed narrower than that of the active layer 23.

A structure illustrated in FIG. 9C may be applied to a transistor where a characteristic curve of a threshold voltage is not as steep.

Figure 10:
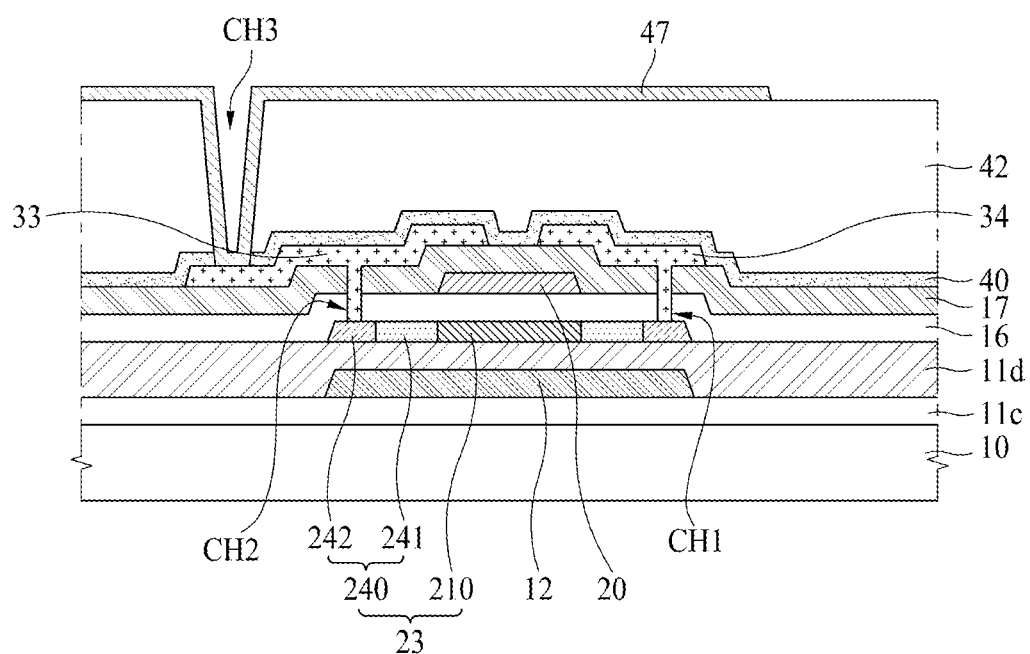
FIG. 10 is an exemplary diagram illustrating a cross-sectional surface of a TFT substrate according to an embodiment of the present invention.

FIG. 10 is an exemplary diagram illustrating a cross-sectional surface of a TFT substrate according to an embodiment of the present invention. For example, a cross-sectional surface of a TFT illustrated in FIG. 10 is a cross-sectional view illustrating the driving transistor Tdr. That is, a bottom shield metal 12 illustrated in FIG. 10 may be the second BSM 12b illustrated in FIG. 5A, and an active layer 23 illustrated in FIG. 10 may be the second active layer 23b illustrated in FIG. 5A, but is not limited thereto.

Particularly, in a TFT substrate illustrated in FIG. 10, an active layer 23 may be divided into a channel 210 and a doping area 240 which is divided into a low-concentration doping area 241 and a high-concentration doping area 242. The doping-concentration of the channel 210 is lower than that of the doping area 240. In the doping area 240, the doping-concentration of the low-concentration doping area 241 is lower than that of the high-concentration doping area 242. The driving transistor Tdr illustrated in FIG. 10 may be a low temperature poly-Si (LTPS) TFT. In the following description, details which are the same as or similar to the above-described details are not described or will be briefly described.

The TFT substrate, as illustrated in FIG. 10, may include a lower substrate 10, a multi-buffer 11c, a BSM 12, an active buffer 11d, an active layer 23, a gate insulation layer 16, a gate 20, an interlayer dielectric 17, a passivation layer 40, a planarization layer 42, and a first electrode 47 of an emission layer.

The lower substrate 10 may include a plastic-based polymer material such as polyimide (PI).

The multi-buffer 11c may be on the lower substrate 10. The multi-buffer 11c may be formed of an insulating material and mitigate a stress which is applied to the active layer 23 by the lower substrate 10. Also, the multi-buffer 11c may block a particle having an electric charge or an electric field caused by polarization. To provide a more detailed description, when the TFT substrate including the lower substrate 10 formed of a plastic-based polymer material such as polyimide (PI) is driven, heat is generated in the lower substrate 10, and a particle having an electric charge generated from the lower substrate 10 is moved to an upper portion of the component structure. In other words, an unintended back-channel phenomenon is occurred by the lower substrate 10. The particle having the electric charge effects the active layer 23 to degrade a reliability of the TFT substrate. Also, the particle having the electric charge causes a flow of an unnecessary current in addition to a flow of a normal current, and for this reason, a service life of the TFT substrate can be shortened. Therefore, the multi-buffer 11c prevents the particle having the electric charge from being transferred to the active layer 23. The multi-buffer 11c may be formed of an inorganic insulating material such as silicon nitride, but is not limited thereto.

The BSM 12 may be disposed on the multi-buffer 11c and may be formed of an conductive material. The BSM 12 effectively blocks a particle having an electric charge or an electric field caused by polarization when the particle or the electric field is transferred without being blocked by the multi-buffer 11c, thereby protecting a channel 210 of the active layer 23. However, an effect of the BSM 12 may be largely changed depending on a length of the BSM 12. An effect of the BSM 12 is relevant to a length of the BSM 12 and a length of the active layer 23. This will be described in detail with reference to FIGS. 11A to 13B.

The active buffer 11d may be disposed on the multi-buffer 11c and the BSM 12. The active buffer 11d may be formed of an insulating material and mitigates a stress which is applied to the active layer 23 by the BSM 12. Also, the active buffer 11d may block a particle having an electric charge. The active buffer 11d may be formed of an inorganic insulating material such as silicon nitride, but is not limited thereto.

The active layer 23 may be on the active buffer 11d. The active layer 23 may include a channel 210, a plurality of low-concentration doping areas 241 which are respectively on one side and the other side of the channel 210 along the direction of the length of the channel 210, and a plurality of high-concentration doping areas 242 which are next to each of the low-concentration doping areas 241 along the direction of the length of the channel 210. In other words, the low-concentration doping area 241 is in between the channel 210 and the high-concentration doping area 242. The low-concentration doping areas 241 and the high-concentration doping area 242 may be formed by doping a dopant on crystalline silicon. The low-concentration doping areas 241 may be lower in dopant-doping concentration than the high-concentration doping area 242. The active layer 23 may be provided to overlap a drain electrode 34 and a source electrode 33. Particularly, the high-concentration doping area 242 may be provided to overlap the drain electrode 34 and the source electrode 33. The active layer 23 may be provided to connect to the drain electrode 34 and the source electrode 33. Particularly, the high-concentration doping area 242 may be connected to the drain electrode 34 and the source electrode 33.

The gate insulation layer 16 may be on the active layer 23b. The gate insulation layer 16 may be formed of an inorganic-based insulating material such as silicon oxide or silicon nitride, but is not limited thereto. For example, the insulation layer 16 may be formed of an organic-based insulating material such as photo acryl or benzocyclobutene (BCB).

The gate 20 may be on the gate insulation layer 16, and particularly, may overlap the channel 210 of the active layer 23. The gate 20 may be connected to the BSM 12 and may act as an additional gate electrode of the TFT so that the TFT substrate may have a double gate structure.

The interlayer dielectric 17 may be formed of a double layer of silicon nitride and silicon oxide.

The drain electrode 34 may be on the interlay dielectric 17. The drain electrode 34 may be connected to the high-concentration doping area 242, which is on one side of the active layer 23, through a first contact hole CH1.

The source electrode 33 may be on the interlayer dielectric 17 to face the drain electrode 34. The source electrode 33 may be connected to the high-concentration doping area 242, which is on the other side of the active layer 23, through a second contact hole CH2.

The first contact hole CH1 and the second contact hole CH2 may be formed by removing a certain region of the gate insulation layer 16 and a certain region of the interlayer dielectric 17.

The passivation layer 40 may be on the interlayer dielectric 17, the source electrode 33, and the drain electrode 34. The passivation layer 40 may be formed of an inorganic-based insulating material such as silicon oxide or silicon nitride, but is not limited thereto. For example, the passivation layer 40 may be formed of an organic-based insulating material such as photo acryl or benzocyclobutene (BCB).

The planarization layer 42 may be on the passivation layer 40. A third contact hole CH3 may be included in the planarization layer 42, and thus, the source electrode 33 may be exposed by the third contact hole CH3. The planarization layer 42 may be formed of an organic polymer material such as an acryl-based polymer.

The first electrode 47 of the OLED may be on the planarization layer 42. The first electrode 47 may be connected to the source electrode 33 through the third contact hole CH3. The first electrode 47, as illustrated in FIG. 5A, may be connected to the BSM 12 and may configure the TFT substrate having a source contact structure. Alternatively, the first electrode 47 may be formed as illustrated in FIG. 6 or FIG. 7.

A relationship between a length of a bottom shield metal 12 and a length of a gate 20 of a TFT formed on the TFT substrate has been described above with reference to FIGS. 9A to 9C. Hereinafter, a relationship between a length of an active layer 23 and a length of the bottom shield metal 12 of a TFT formed on the TFT substrate will be described in more detail with reference to FIGS. 11A to 13B.

Among the drawings to be referenced below, lengths of BSMs of TFT substrates illustrated in FIGS. 11A, 12A, and 13A may differ. Also, FIGS. 11B, 12B, and 13B are graphs representing a luminance uniformity of each display devices obtained by measuring a gate voltage (Vg) and a drain-source current (Ids) at four, same edges and four, same central points of a lower substrate of respective display devices including the TFT substrates illustrated in FIGS. 11A, 12A, and 13A. Each of the graphs shows a luminance uniformity of each of display devices. In this case, a graph of a gate voltage (Vg) and a drain-source current (Ids) eight matching values have been measured when a drain-source voltage (Vds) is 10 V. In each of the graphs, the X axis indicates a gate voltage (Vg), and the Y axis indicates a drain-source current (Ids). Therefore, as the eight lines overlap each other more closely, it can be seen that the degree of dispersion of a transistor characteristic at the four edges and four central points in the display device decreases. In other words, as the eight lines overlap each other more closely, it means a luminance uniformity of the display device increases. In each of the graphs, the left with respect to 0 V on the X axis is an off current area, and the right is an on current area. The off current area is an area which indicates a current when a display device is turned off, and the on current area is an area which indicates a current when the display device is turned on.

Each of TFTs illustrated in FIGS. 11A, 12A, and 13A, to be described below, may be one of various kinds of TFTs formed on the TFT substrate as described above with reference to FIGS. 9A to 10 and the bottom shield metal may correspond to the one TFT. Each of bottom shield metals illustrated in FIGS. 11A, 12A, and 13A may be referred to by 12, each of gates may be referred to by 20, and each of active layers may be referred to by 23. Also, as described above with reference to FIG. 10, the active layer 23 illustrated in FIGS. 11A, 12A, and 13A may include a channel 210, a low-concentration doping area 241, and a high-concentration doping area 242. In other words, the bottom shield metal 12 illustrated in FIGS. 11A, 12A, and 13A may be the first BSM 12a, the second BSM 12b or the third BSM (not shown) in FIGS. 5A to 8E, or the BSM 12 in FIG. 10, but is not limited thereto. Therefore, the gate 20 illustrated in in FIGS. 11A, 12A, and 13A may be the second gate 20b of the driving transistor Tdr, the first gate 20a of the switching transistor Tsw, the third gate of the sensing transistor Tss, or the gate 20 in FIG. 10, but is not limited thereto. Also, the active layer 23 illustrated in FIGS. 11A, 12A, and 13A may be the first active layer 23a of the switching transistor Tsw, the second active layer 23b of the driving transistor Tdr, the third active layer (not shown) of the sensing transistor Tss, or the active layer 23 in FIG. 10, but is not limited thereto.

In the following description, details which are the same as or similar to the above-described details are not described or will be briefly described.

Figure 11A:
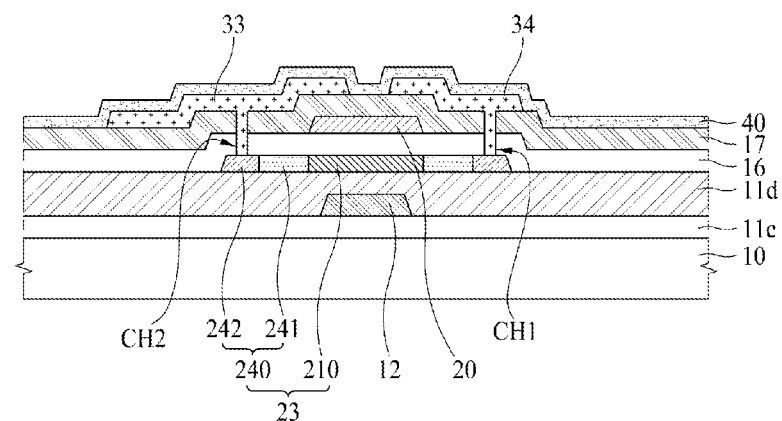
FIG. 11A is an exemplary diagram illustrating a cross-sectional surface of a TFT substrate according to an embodiment of the present invention.
Figure 11B:
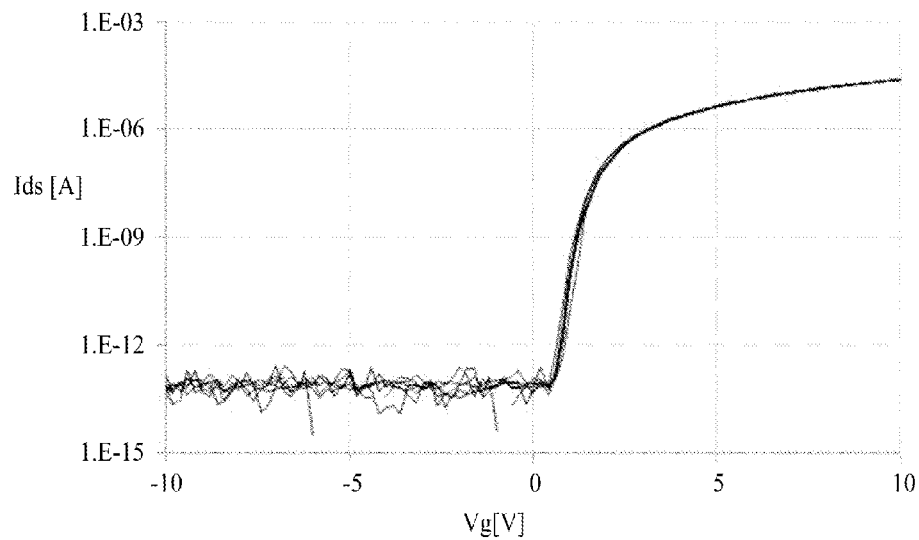
FIG. 11B is a graph showing a brightness scattering of the TFT substrate illustrated in FIG. 11A.

FIG. 11A is an exemplary diagram illustrating a cross-sectional surface of a TFT substrate according to an embodiment of the present invention, and FIG. 11B is a graph showing a luminance uniformity of a display device containing the TFT substrate illustrated in FIG. 11A.

First, referring to FIG. 11A, the bottom shield metal 12 may overlap a portion of the active layer ACT and a portion of the channel 210, but the bottom shield metal 12 may not overlap the low-concentration doping area 241 and the high-concentration doping area 242. To provide a more detailed description, in order for a length of the bottom shield metal 12 to be narrower than that of the channel 210, the bottom shield metal 11 may overlap with a center, partial position of the channel 210.

Second, when a length of the bottom shield metal 12 is narrower than that of the channel 210 as illustrated in FIG. 11A, a degree of dispersion at an introduction portion of an on current area increases as illustrated in FIG. 11B, and thus, a plurality of lines are shown. This denotes that a degree of dispersion of a threshold voltage increases. Such a characteristic of the graph is generated by a distance between the bottom shield metal 12 and the channel 210. An increase in the degree of dispersion of the threshold voltage degrades a reliability of a TFT substrate. For example, the increase in the degree of dispersion of the threshold voltage decreases a luminance uniformity of a display device.

To provide an additional description, as illustrated in FIG. 11B, the introduction portion of the on current area (That is, a portion where a drain-source current (Ids) increases rapidly) is relevant to the threshold voltage, and in a structure illustrated in FIG. 11A, the constant threshold voltage is difficult to maintain. Therefore, the structure illustrated in FIG. 11A may be applied to a transistor (for example, the switching transistor Tsw) which is less affected by a change in a characteristic of the threshold voltage.

Figure 12A:
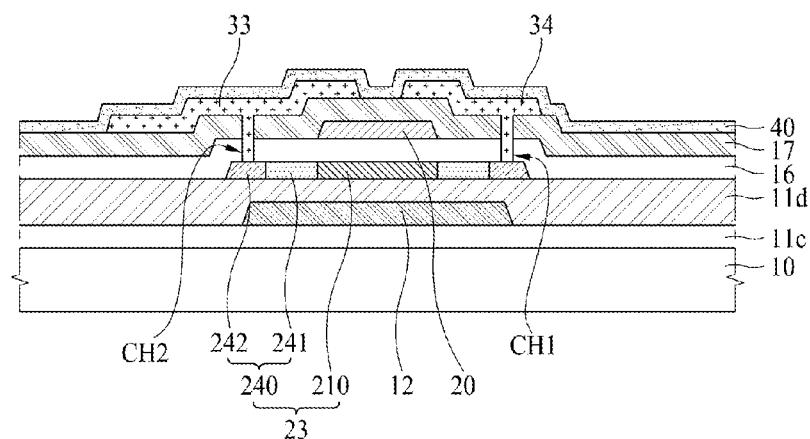
FIG. 12A is another exemplary diagram illustrating a cross-sectional surface of a TFT substrate according to an embodiment of the present invention.
Figure 12B:
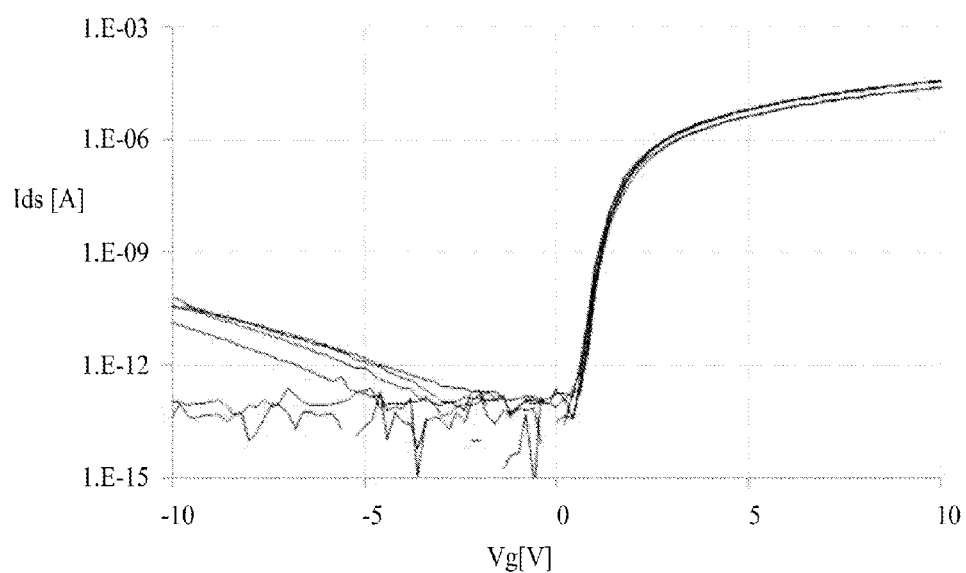
FIG. 12B is a graph showing a brightness scattering of the TFT substrate illustrated in FIG. 12A.

FIG. 12A is another exemplary diagram illustrating a cross-sectional surface of a TFT substrate according to an embodiment of the present invention, and FIG. 12B is a graph showing a luminance uniformity of a display device containing the TFT substrate illustrated in FIG. 12A. Except for a structure of a bottom shield metal 12, a structure of a TFT substrate illustrated in FIG. 12A is the same as that of the TFT substrate illustrated in FIG. 11A.

First, referring to FIG. 12A, the bottom shield metal 12 may overlap entire portion of the channel 210 and a entire portion of the low-concentration doping area 241 and overlap a portion of the high-concentration doping area 242. In other words, the bottom shield metal 12 may overlap entire portion of the channel 210 and a part of entire portion of the doping area 240.

Second, when the bottom shield metal 12 covers the channel 210, the low-concentration doping area 241, and a portion of the high-concentration doping area 242 as illustrated in FIG. 12A, a degree of dispersion at an introduction portion of an off current area increases as illustrated in FIG. 12B, and thus, a plurality of lines are shown. The reason is because the bottom shield metal 12 overlaps entire portion of the low-concentration doping area 241, and thus, a resistance of the low-concentration doping area 241 is reduced by a voltage generated from the bottom shield metal 12, whereby the low-concentration doping area 241 operates along with the high-concentration doping area 242. That is, the low-concentration doping area 241 cannot perform a role thereof, and thus, a degree of dispersion of the off current area and a degree of dispersion of an on current area increase, causing a reduction in a reliability of a TFT substrate. To provide an additional description, when a length of the bottom shield metal 12 is formed to have an undesired longer length, a side effect occurs due to an increase in a parasitic capacitance.

Therefore, a structure illustrated in FIG. 12A may be applied to a transistor which is less affected by a change in a characteristic in the on current area and the off current area.

Figure 13A:
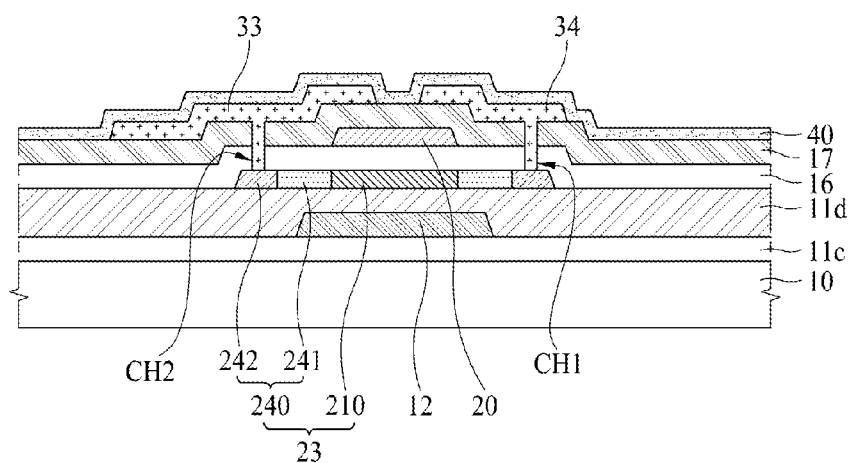
FIG. 13A is another exemplary diagram illustrating a cross-sectional surface of a TFT substrate according to an embodiment of the present invention.
Figure 13B:
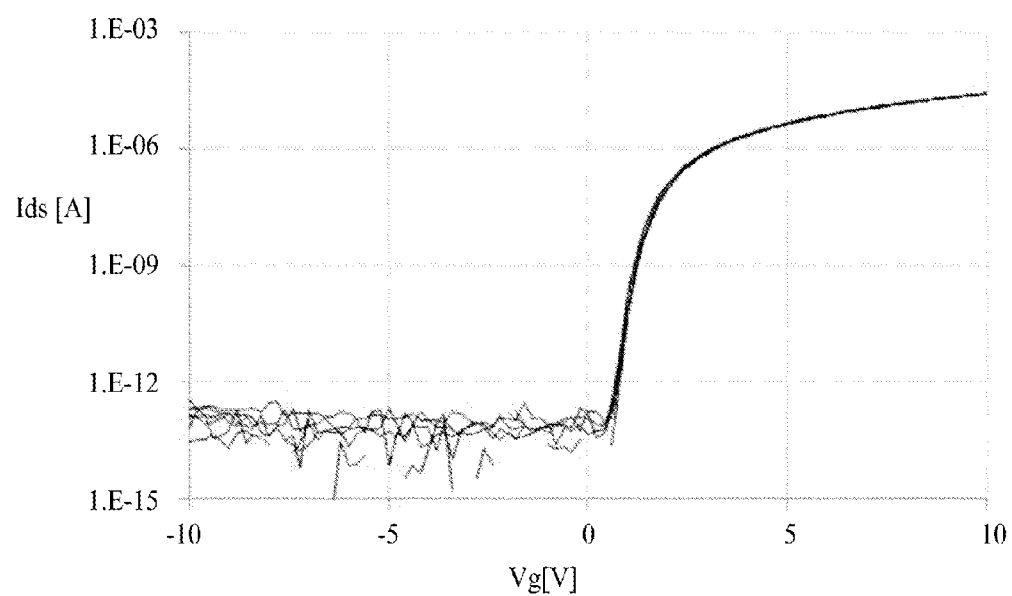
FIG. 13B is a graph showing a brightness scattering of the TFT substrate illustrated in FIG. 13A.

FIG. 13A is another exemplary diagram illustrating a cross-sectional surface of a TFT substrate according to an embodiment of the present invention, and FIG. 13B is a graph showing a luminance uniformity of a display device containing the TFT substrate illustrated in FIG. 13A.

First, referring to FIG. 13A, the bottom shield metal 12 may overlap entire portion of the channel 210 and a portion of the low-concentration doping area 241 of the active layer ACT, but may not overlap the high-concentration doping area 242. To provide a more detailed description, the bottom shield metal 11 may cover entire portion of the channel 210 and a part of entire portion of the low-concentration doping area 241. Even though the bottom shield metal 12 covers entire portion of the channel 210 only, it is enough that the bottom shield metal 12 blocks a particle having an electric charge or an electric field caused by polarization. However, considering a margin of a manufacturing process, the bottom shield metal 12 covering a part of entire portion of the low-concentration doping area 241 is the most efficient.

When the bottom shield metal 11 covers a portion of the low-concentration doping area 241 and entire portion of the channel 210 as illustrated in FIG. 13A, eight lines show uniform as illustrated in FIG. 13B. Particularly, a degree of dispersion of eight lines definitely decreases at an introduction portion of an on current area, which is represented to a threshold voltage. In other words, an introduction portion of an on current area (i.e., a portion where a drain-source current (Ids) increases rapidly) is represented to a threshold voltage.

The graph of FIG. 13B shows that when the bottom shield metal 12 covers a portion of the low-concentration doping area 241 and the channel 210 as illustrated in FIG. 13A, a luminance uniformity of a display device is uniformly shown, and a side effect caused by a particle having an electric charge is reduced.

Therefore, when a TFT substrate which is configured as illustrated in FIG. 13A is driven, the bottom shield metal 12 which is formed of a plastic-based polymer material such as polyimide (PI) on the lower substrate 10 effectively blocks a particle having an electric charge which is generated when heat generated from the lower substrate 10 is moved to an upper portion.

Moreover, the threshold voltages of the transistors in the TFT substrate illustrated in FIG. 13A, have almost the same value. In other words, a degree of dispersion of the threshold voltage of the TFT substrate definitely decreases. Therefore, the structure illustrated in FIG. 13A may be applied to a transistor (for example, the driving transistor Tdr) which is largely affected by a change in a characteristic of the threshold voltage.

Figure 14:
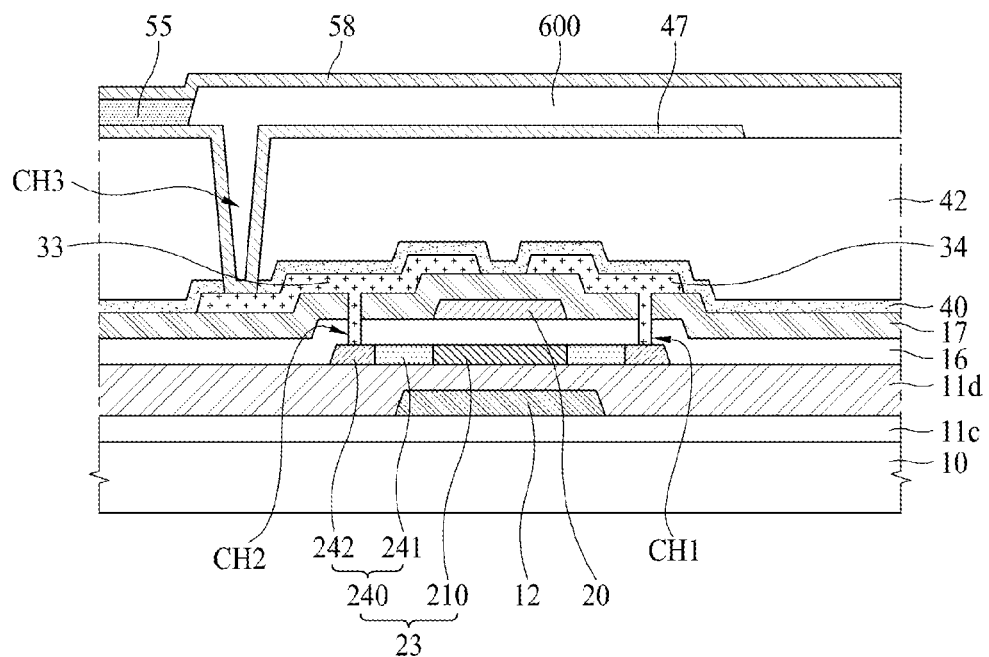
FIG. 14 is an exemplary diagram illustrating a cross-sectional surface of an organic light-emitting display panel according to an embodiment of the present invention.

FIG. 14 is an exemplary diagram illustrating a cross-sectional surface of an organic light-emitting display panel according to an embodiment of the present invention, and particularly, is an exemplary diagram illustrating a cross-sectional surface of an organic light-emitting display panel including the TFT substrate of FIG. 13A.

As illustrated in FIG. 14, the organic light-emitting display panel according to an embodiment of the present invention may include a TFT substrate, a bank layer 600, an emission layer 55, and a second electrode 58. Here, the TFT substrate may include a lower substrate 10, a multi-buffer 11c, a bottom shield matal BSM, an active buffer 11d, a active layer 23, a gate insulation layer 16, a gate 20, an interlayer dielectric 17, a drain electrode 34, a source electrode 33, a passivation layer 40, a planarization layer 42, and a first electrode 47.

The elements ranging from the lower substrate 10 to the first electrode 47 are the same as the elements of the TFT substrate described above with reference to FIGS. 10 and 13A, and thus, their detailed descriptions are not provided. The first electrode 47 may perform a function of an anode of an OLED.

The bank layer 600 and the emission layer 55 may be on the first electrode 47. The bank layer 600 may be formed in a matrix structure to define a plurality of pixels, and the emission layer 55 may be in each of the plurality of pixels. The emission layer 55 may be formed by a combination of a hole injection layer, a hole transport layer, an organic emission layer, an electron transport layer, and an electron injection layer, but is not limited thereto. The emission layer 55 may be changed to have various structures known to those of ordinary skill in the art. The second electrode 58 may be on the emission layer 55. The second electrode 58 may perform a function of a cathode of the organic light-emitting display panel.

For example, FIG. 14 illustrates the organic light-emitting display panel according to an embodiment of the present invention. However, the organic light-emitting display panel according to an embodiment of the present invention is not limited to a structure illustrated in FIG. 14. Therefore, the organic light-emitting display panel according to an embodiment of the present invention may be configured in various structures including the above-described TFT substrate.

Figure 15:
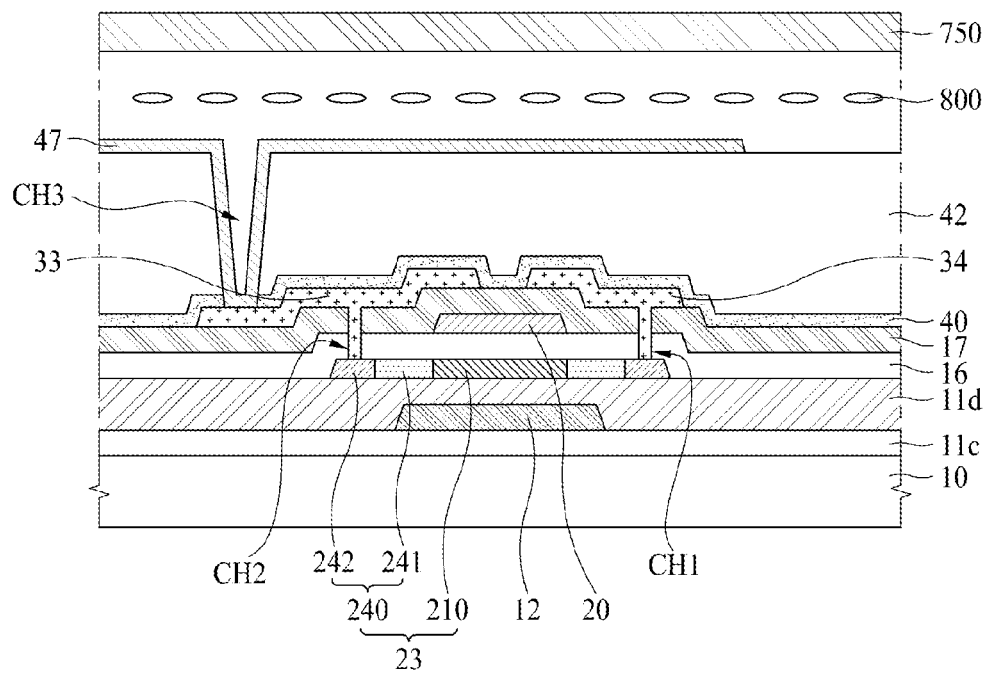
FIG. 15 is an exemplary diagram illustrating a cross-sectional surface of a liquid crystal display panel according to an embodiment of the present invention.

FIG. 15 is an exemplary diagram illustrating a cross-sectional surface of a liquid crystal display panel according to an embodiment of the present invention, and particularly, is an exemplary diagram illustrating a cross-sectional surface of a liquid crystal display panel including the TFT substrate of FIG. 13A.

As illustrated in FIG. 15, the liquid crystal display panel according to an embodiment of the present invention may include a TFT substrate, an upper substrate 750 facing the TFT substrate, and a liquid crystal layer 800 formed between the TFT substrate and the upper substrate 750. Here, the TFT substrate may include a lower substrate 10, a multi-buffer 11c, a bottom shield metal 12, an active buffer 11d, a active layer 23, a gate insulation layer 16, a gate 20, an interlayer dielectric 17, a drain electrode 34, a source electrode 33, a passivation layer 40, a planarization layer 42, and a first electrode 47.

Although the upper substrate 750 is not specifically illustrated, the upper substrate 750 may include a black matrix and a light shield layer. The liquid crystal display panel according to an embodiment of the present invention may be provided in various modes, known to those of ordinary skill in the art, such as a twisted nematic (TN) mode, a vertical alignment (VA) mode, an in-plane switching (IPS) mode, and a fringe field switching (FFS) mode, and thus, a structure of the upper substrate 750 may be variously changed. Also, the TFT substrate may further include a common electrode which is formed on the same layer as that of the first electrode 47 and drives the liquid crystal layer 800.

The above-described details of the present invention will be briefly summarized below.

In the present invention, the BSMs 12 is formed under respective TFTs of the TFT substrate including the lower substrate 10 formed of plastic such as polyimide (PI), and thus, the following effects are obtained. Accordingly, a characteristic of the TFT is prevented from being changed, and a stability of the TFT is increased.

First, the active layer of the TFT is protected from electric charges.

Second, the TFT on the BSM is prevented from being damaged in the laser release process.

Third, a capacitance is generated between the BSM under the TFT and the active layer of the TFT, and thus, it is possible to manufacture a high-resolution TFT substrate.

Fourth, when driving the TFT on the BSM, a characteristic of the TFT is prevented from being changed due to thermal damage which occurs in the lower substrate, the active buffer, and the multi-buffer.

Fifth, the sacrificial layer is electrified to a negative polarity (<0 V) due to problems of the related art, for example, a back channel phenomenon which occurs in the lower substrate formed of plastic and the sacrificial layer, and thus, the threshold voltage of the TFT is shifted. Accordingly, a characteristic of the TFT is prevented from being changed.

Sixth, in a device structure of the TFT substrate according to an embodiment of the present invention, it is easy to secure a storage capacitor, and moreover, a capacitor may be further formed between the active layer and the BSM.

Seventh, because the BSM is used as the additional gate electrode of the driving transistor on thereof, a double gate effect is expected.

When the active buffer is manufactured in a double structure or a triple structure, the BSM may be between any two layers of the active buffer. Also, the BSM may be between any two layers of the multi-buffer. Also, the BSM may be used as a storage capacitor in each pixel, and moreover may be used as a wire of other electrode.

Because a voltage of the switching transistor is continuously shifted, the BSM may be formed in a floating state without being connected to a specific metal supplied a voltage. Therefore, the following effects are obtained by using the BSM.

First, a characteristic of the switching transistor is prevented from being changed by light in a module assembly process of display device which is made of a plastic lower substrate.

Second, a characteristic of the switching transistor is prevented from being changed when light is applied to the channel of the switching transistor.

Third, mora is prevented from occurring when a characteristic of the switching transistor is changed by light input from the outside.

Fourth, the TFT substrate is manufactured, and then, a characteristic of the switching transistor is prevented from being changed by light while the TFT substrate is being stored or moved.

Fifth, the TFT substrate is manufactured, and then, a characteristic of the switching transistor is prevented from being changed by light which occurs in a system.

However, the switching transistor may be connected to one of various kinds of electrodes formed on the TFT substrate.

The BSM may be formed under the sensing transistor. The BSM may be connected to an electrode of the sensing transistor on thereof.

Finally, the above-described BSM may be formed in various kinds of TFTs (for example, a compensation transistor) formed on the TFT substrate.

To provide an additional description, the BSM may be formed under TFTs other than the driving transistor, the switching transistor, and the sensing transistor among the transistors which are formed on the TFT substrate. The transistors may be floated and may be connected to an electrode of the TFT on thereon.

Figure 16:
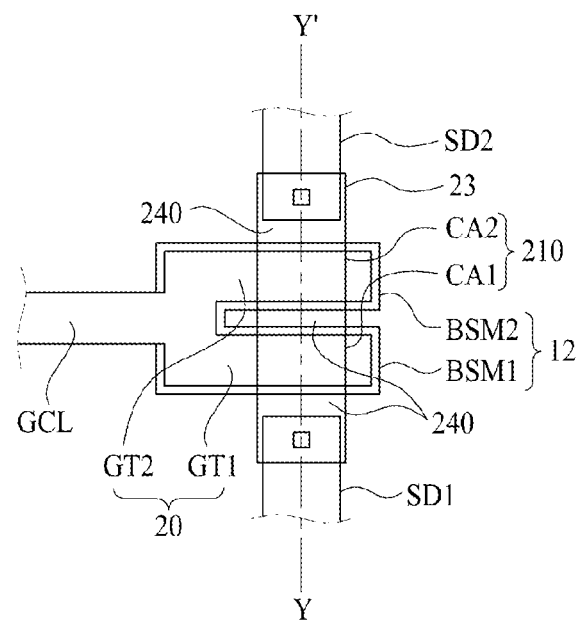
FIG. 16 is a plan view illustrating a driving transistor of one pixel of a TFT substrate according to a fourth embodiment of the present invention.
Figure 17:
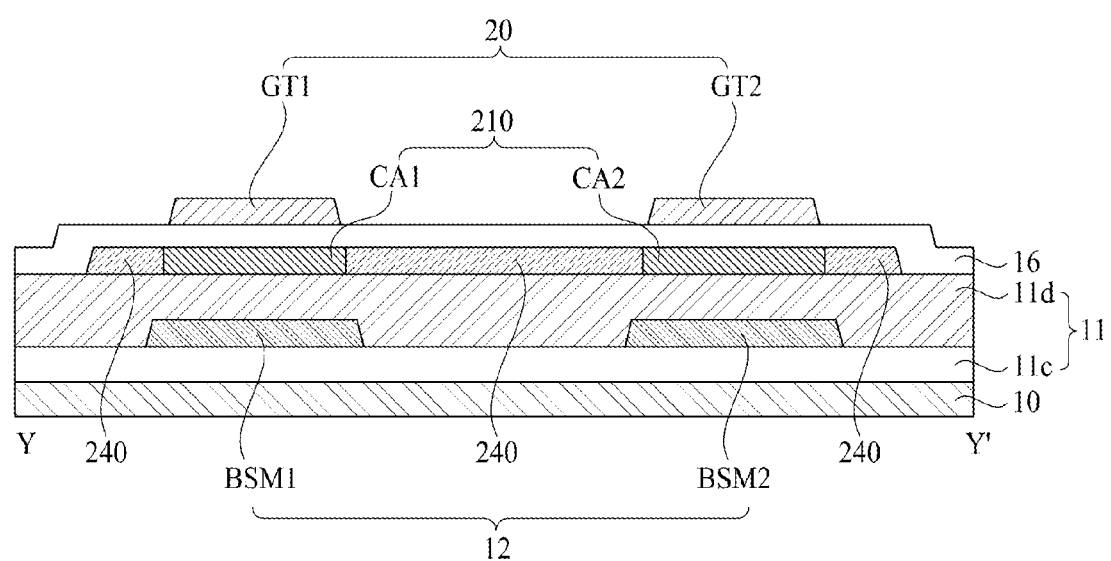
FIG. 17 is a cross-sectional view taken along line Y-Y' of FIG. 16 illustrating the driving transistor.

FIG. 16 is a plan view illustrating a dual gate TFT of one pixel of a TFT substrate according to a fourth embodiment of the present invention, and FIG. 17 is a cross-sectional view taken along line Y-Y' of FIG. 16 illustrating the TFT.

The bottom shield metal 12 illustrate in FIGS. 16 and 17 may be the first BSM 12a, the second BSM 12b, the third BSM (not shown) or the BSM illustrated in FIGS. 9A to 15, but is not limited thereto. The gate 20 illustrated in FIGS. 16 and 17 may be the first gate 20a, the second gate 20b, the third gate (not shown) or the gate 20 illustrate in FIGS. 9A to 15, but is not limited thereto. Also, the active layer 23 illustrate in FIGS. 16 and 17 may be the first active layer 23a of the switching transistor Tsw, the second active layer 23b of the driving transistor Tdr, the third active layer (not shown) of the sensing transistor Tss or the active layer 23 illustrated in FIGS. 9A to 15, but is not limited thereto.

As described above with reference to FIGS. 9A to 15, a TFT illustrated in FIGS. 16 and 17 to be described below may be one of various kinds of TFTs formed on the TFT substrate, and the BSM may correspond to the TFT thereunder. Therefore, the BSM illustrated in FIGS. 9A to 15 may be referred to by 12 in FIGS. 16 and 17, the gate illustrated in FIGS. 9A to 15 may be referred to by 20 in the FIGS. 16 and 17 and the active layer illustrate in FIGS. 9A to 15 may be referred to by 23 in FIGS. 16 and 17.

Referring to FIGS. 16 and 17, the gate 20 may be divided into a first gate terminal GT1 and a second gate terminal GT2, and the active layer 23 may include a channel 210 which is divided into a first channel CA1 and a second channel CA2, and a plurality of doping areas 240, and the BSM 12 may have U-shape and divided into a first bottom shield metal terminal BSM1 and a second bottom shield metal terminal BSM2. For example, the TFT illustrated in FIGS. 16 and 17 may be a driving transistor, but is not limited thereto. For example, the TFT illustrated in FIGS. 16 and 17 may be an LTPS TFT, but is not limited thereto.

An LTPS TFT may be formed on the TFT substrate according to the fourth embodiment of the present invention. The LTPS TFT is high in mobility of an electric charge and thus, is suitable for a high-resolution display device requiring a fast response time.

In the LTPS TFT, a gate 20 may be on the active layer 23. In this case, there is a high possibility that an off current is generated. Therefore, as illustrated in FIGS. 16 and 17, the LTPS TFT may be dual gate TFT manufactured by using two gate terminals GT1 and GT2 and two channels CA1 and CA2.

For example, as illustrated in FIG. 17, the flexible TFT substrate according to the fourth embodiment of the present invention may include the lower substrate 10, the buffer 11 which are formed on the lower substrate 10, and the active layer 23 which is insulated from the BSM 12 configuring the buffer 11 and overlaps the BSM 12. Also, the flexible TFT substrate may include a TFT which is formed on the buffer 11, a planarization layer (not shown) which is formed on the TFT, and a first electrode of an OLED (not shown) which is formed on the planarization layer (not shown) and is driven by the TFT to emit light.

A configuration and a function of each of the planarization layer (not shown) and the OLED (not shown) are the same as the configuration and the function described above in the first to third embodiments, and thus, their detailed descriptions are not provided.

A structure of the TFT applied to the fourth embodiment of the present invention differs from that of the TFT applied to the first to third embodiments of the present invention.

The TFT applied to the fourth embodiment of the present invention may be the switching transistor Tsw or the driving transistor Tdr described above in the first to third embodiments, or may be a different TFT instead of the switching transistor Tsw or the driving transistor Tdr.

As illustrated in FIG. 16, the TFT applied to the fourth embodiment of the present invention, may have U-shape and include the first gate terminal GT1 and the second gate terminal GT2 which branch from one gate connection line GCL. Therefore, the first gate terminal GT1 may be connected to the second gate terminal GT2. The BSM 12 may include the first bottom shield metal terminal BSM1 overlapping the first gate terminal GT1 and the second bottom shield metal terminal BSM2 overlapping the second gate terminal GT2 which is under the TFT corresponding to the shape of the TFT. The channel 210 of the active layer 23 may include the first channel area CA1 overlapping the first gate terminal GT1 and the second channel area CA2 overlapping the second gate terminal GT2.

As illustrated in FIG. 16, one of the doping areas 240 is in between the first channel area CA1 and the second channel area CA2 and the rest of the two doping areas 240 are in two edges of the active area 23 along the direction of the length of the channel 210, respectively. That is, although not illustrated in FIG. 17, a source electrode SD1 and a drain electrode SD2 illustrated in FIG. 16 are connected to the two doping areas 240 located in two edges of the active layer 23 along the direction of the length of the channel, respectively.

As illustrated in FIG. 16, the BSM 12 may have U-shape and be formed to overlap both the first channel CA1 and the second channel CA2. Also, the BSM 12 may have U-shape and be formed to overlap both the first gate terminal GT1 and the second gate terminal GT2 of the gate 20 having U-shape. Also the doping area 240 next to the first channel CA1 may be connected to the source electrode SD1 of the TFT, and the doping area 240 next to the second channel CA2 may be connected to the drain electrode SD2 of the TFT.

Figure 18:
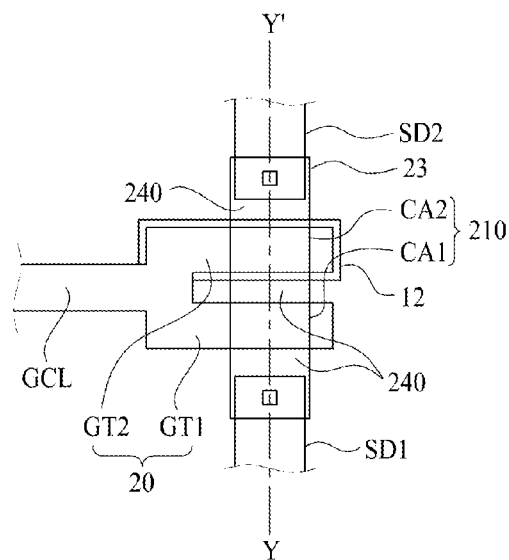
FIG. 18 is a plan view illustrating a driving transistor of one pixel of a TFT substrate according to a fifth embodiment of the present invention.
Figure 19:
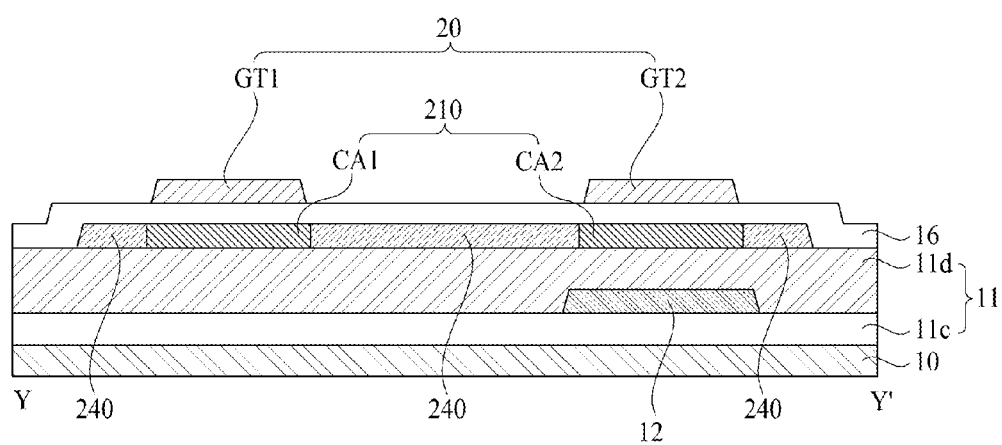
FIG. 19 is a cross-sectional view taken along line Y-Y' of FIG. 18 illustrating the driving transistor.

FIG. 18 is a plan view illustrating a dual gate TFT of one pixel of a TFT substrate according to a fifth exemplary embodiment of the present invention. FIG. 19 is a cross-sectional view taken along line Y-Y' of FIG. 18 illustrating the TFT.

Referring to FIGS. 18 and 19, the gate 20 may have U-shape and be divided into a first gate terminal GT1 and a second gate terminal GT2, and the active layer 23 may include a channel 210 which is divided into a first channel CA1 and a second channel CA2, and a plurality of doping areas 240, and the BSM 12 may have I-shape.

As illustrated in FIG. 18, the BSM 12 may have I-shape and overlap either one of the first channel CA1 or the second channel CA2. Also, the BSM 12 may have I-shape and overlap either one of the first gate terminal GT1 or the second gate terminal GT2. Also, the doping area 240 next to the first channel CA1 may be connected to the source electrode SD1 of the TFT, and the doping area 240 next to the second channel CA2 may be connected to the drain electrode SD2 of the TFT.

According to the fifth embodiment of the present invention illustrated in FIGS. 18 and 19, to provide an additional description, the doping area 240 next to the first channel CA1 may be connected to the source electrode SD1, and the doping area 240 next to the second channel CA2 may be connected to the drain electrode SD2. The BSM 12 may be formed under one of the two channels CA1 and CA2 which is next to either the source electrode SD1 or the drain electrode SD2 receiving a higher voltage among the source and the drain electrodes SD1 and SD2. In other words, The BSM 12 may be closer to either one that is supplied a higher voltage among the source electrode SD1 and the drain electrode SD2 of the TFT thereon. Also, the BSM 12 may be formed under one of the two channels CA1 and CA2 which is next to either the source electrode SD1 or the drain electrode SD2, where a voltage-difference with a gate voltage is higher, among the source and the drain electrodes SD1 and SD2.

For example, when a voltage-difference between a voltage supplied to the drain electrode SD2 and the gate voltage supplied to the gate 20 is higher than a voltage-difference between a voltage supplied to the source electrode SD1 and the gate voltage supplied to the gate 20, the BSM12 may be formed to overlap the second channel CA2 next to the drain electrode SD2.

Since one of the first and the second bottom shield metal terminals BSM1 and BSM2 described above in the fourth embodiment is formed on the TFT substrate according to the fifth embodiment of the present invention, it is easier to design and form a BSM.

Moreover, a size of a BSM 12 including one bottom shield metal terminal BSM2 is narrower than that of a BSM 12 including two bottom shield metal terminals BSM1 and BSM2, and thus, in the TFT substrate applied to the fifth embodiment of the present invention, a parasitic capacitance between the BSM 12 and the gate 20 of a TFT is reduced and a driving characteristic of the TFT is not largely changed.

Except for the above-described features, other elements of the fourth embodiment of the present invention may be configured in the same way to the other embodiments described in the present disclosure (e.g. the fifth embodiment of the present invention). That is, except for size and shape of the BSM 12 and overlapping structure between the dual gate TFT and the BSM, a structure of the TFT substrate depicted in FIGS. 18 and 19 may be the same as that of the TFT substrate according to the other embodiments (e.g. a structure of the TFT substrate depicted in FIGS. 16 and 17) of the present invention.

Figure 20:
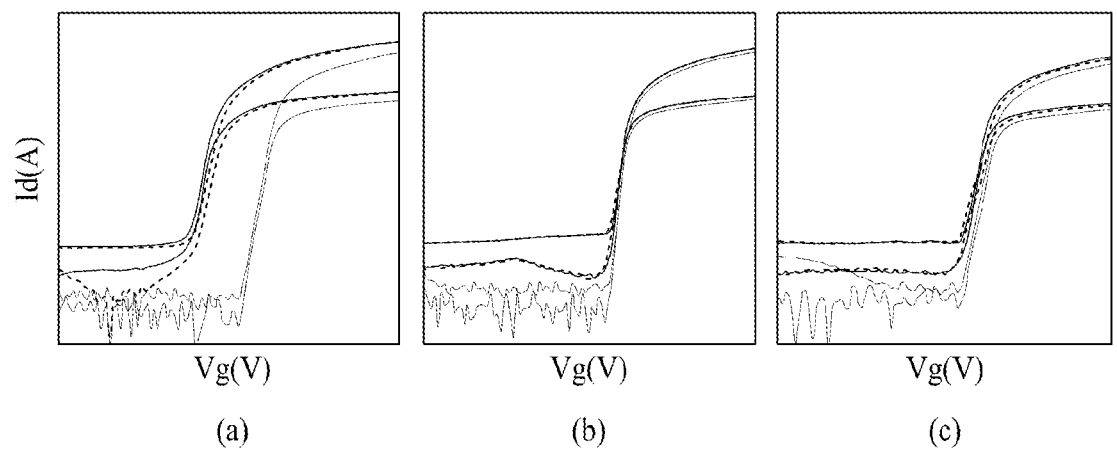
FIG. 20 is a graph showing a change in characteristic caused by the presence of a bottom shield metal.

FIG. 20 is graphs showing a change in driving characteristics caused by the presence of a BSM. To provide an additional description, FIG. 20 is graphs showing a change in a transistor operating characteristic when a positive bias temperature stress (PBTS) is applied. PBTS is an experimental condition used to test the characteristics of a TFT. In FIG. 20, a difference between each shape of lines in a graph means a deviation of operation characteristics of TFTs in a display panel which is undesirable.

A portion (a) of FIG. 20 shows characteristics of TFTs in a display panel which does not include a BSM, a portion (b) of FIG. 20 shows characteristics of TFTs in a display panel where the first bottom shield metal BSM1 and the second bottom shield metal BSM2 are formed to respectively overlap the two channels CA1 and CA2 as illustrated in FIGS. 16 and 17, and a portion (c) of FIG. 20 shows characteristics of TFTs in a display panel where the BSM 12 is formed to overlap only one of the two channel areas CA1 and CA2 as illustrated in FIGS. 18 and 19. For example, the TFT applied to the display panels of FIG. 20 may be LTPS type. In this case, the TFT may be a dual gate TFT and include two gate terminals GT1 and GT2 and two channels CA1 and CA2.

The BSM 12 illustrated in FIGS. 16 and 17 overlapping the two channels CA1 and CA2 may be formed in the buffer 11. For example, when an interval between the two gate terminals GT1 and GT2 is, for example, 4 μm, an interval between the first bottom shield metal terminal BSM1 and the second bottom shield metal terminal BSM2 may be 1 μm. In this case, because the interval between the first bottom shield metal terminal BSM1 and the second bottom shield metal terminal BSM2 is narrow, it is difficult to design and implement the first bottom shield metal terminal BSM1 and the second bottom shield metal terminal BSM2. Moreover, a parasitic capacitance between the BSM 12 and the gate 20 is large, and for this reason, a characteristic of the transistor is changed.

The fifth embodiment of the present invention illustrated in FIGS. 18 and 19 is proposed in consideration of the limitations of the fourth embodiment illustrated in FIGS. 16 and 17, namely, a narrow interval between the first bottom shield metal terminal BSM1 and the second bottom shield metal terminal BSM2 and the parasitic capacitance.

The BSM 12 illustrated in FIGS. 18 and 19 overlapping either one of the first channel CA1 or the second channel CA2 may be formed in the buffer 11. In comparison with the fourth embodiment illustrated in FIGS. 16 and 17, the TFT substrate according to the fifth embodiment of the present invention illustrated in FIGS. 18 and 19 has a difference in that the BSM 12 of the fifth embodiment corresponds to only the second bottom shield metal terminal BSM2 of the fourth embodiment. Therefore, in a description on the fifth embodiment, a size of the BSM 12 of the fifth embodiment is smaller than a size of the BSM 12 of the fourth embodiment, and a shape of the BSM 12 of the fifth embodiment is I-shape or linear shape not forming branches while the BSM 12 of the fourth embodiment is U-shape or curved shape forming branches. The BSM 12 illustrated in FIGS. 18 and 19 may overlap only one of the first channel CA1 and the second channel CA2. Particularly, in FIGS. 18 and 19, a TFT substrate where the BSM 12 is formed in an area overlapping the second channel CA2 is illustrated.

As a simulation and actual measurement result, a characteristic (see the portion (c) of FIG. 20) of the TFT substrate including the BSM 12 according to the fifth embodiment is better than a characteristic (see the portion (a) of FIG. 20) of a TFT substrate having no a BSM, and is substantially equal to a characteristic (see the portion (b) of FIG. 20) of the TFT substrate including the BSM 12 according to the fourth embodiment.

In this case, it can be seen that a characteristic difference of each lines of TFTs applied to the TFT substrate at the different location respectively according to the fifth embodiment of the present invention (see the portion (c) of FIG. 20) is smaller than a characteristic difference of each lines of TFTs applied to a TFT substrate having no a BSM (see the portion (a) of FIG. 20) at the different location respectively. Also, it can be seen that a characteristic difference of each lines of TFTs applied to the TFT substrate according to the fifth embodiment of the present invention (see the portion (c) of FIG. 20) is similar to a characteristic of each lines of TFTs applied to the TFT substrate according to the fourth embodiment of the present invention difference (see the portion (b) of FIG. 20).

Although the fourth embodiment of the present invention (see the portion (b) of FIG. 20) has the smallest deviation of operation characteristics of TFT among a display panel having no a BSM corresponding to the portion (a), the fourth embodiment of the present invention corresponding to the portion (b) and the fifth embodiment of the present invention corresponding to the portion (c) of FIG. 20, each linear portion having+slope of the lines in each graphs which means a driving characteristic of a TFT related to Vth of the portion (b) and the portion (c) of FIG. 20 is substantially the same. That is, a reliability of a TFT included in a TFT substrate including a BSM 12 of the fifth embodiment is substantially equal to a reliability of a TFT included in a TFT substrate including a BSM 12 of the fourth embodiment. In this respect, a characteristic (see the portion (c) of FIG. 20) of the TFT substrate including the BSM 12 according to the fifth embodiment is substantially equal to a characteristic (see the portion (b) of FIG. 20) of the TFT substrate including the BSM 12 according to the fourth embodiment.

Therefore, according to the fifth embodiment, it is easier to design and manufacture a TFT substrate including a high-reliability transistor.

A method of manufacturing the TFT substrate according to the fourth or fifth embodiment of the present invention is substantially equal to the method of manufacturing the TFT substrate according to the first to third embodiments of the present invention.

Figure 21:
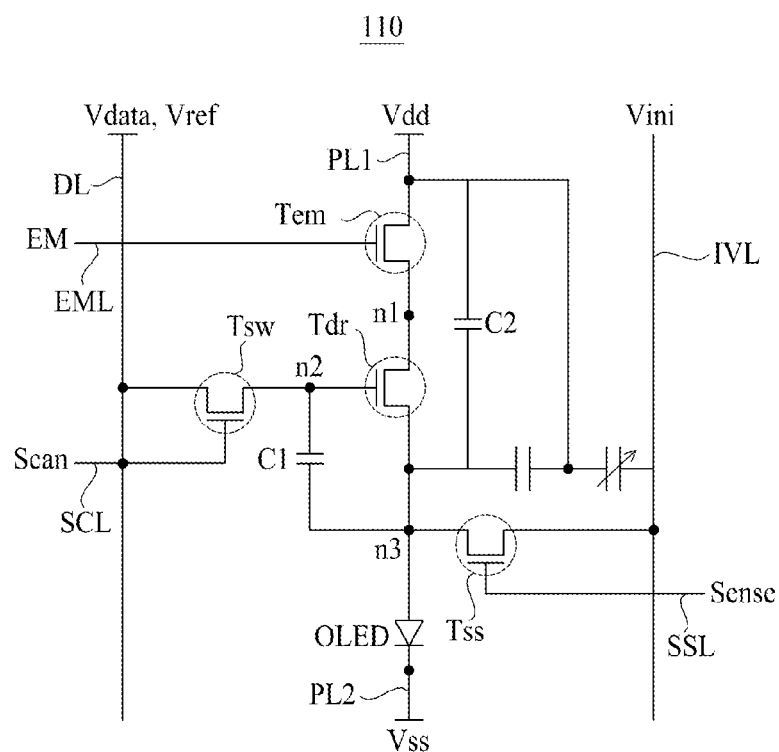
FIG. 21 is a circuit diagram for describing a pixel structure of a TFT substrate according to a sixth embodiment of the present invention.

FIG. 21 is a circuit diagram for describing a pixel circuit structure in a TFT substrate according to a sixth embodiment of the present invention, and particularly, illustrates the pixel 110 of FIG. 3. In the following description, a node BSM 13 may overlap one of nodes of a pixel circuit. To provide an additional description, the node BSM denotes a bottom shield metal which is formed under one of nodes of the pixel circuit in the TFT substrate.

Referring to FIG. 21, the pixel 110 may include an organic light-emitting diode OLED, a driving transistor Tdr, a switching transistor Tsw, a sensing transistor Tss, an emission transistor Tem, and a plurality of capacitors C1 and C2. Here, the plurality of capacitors C1 and C2 may include a first capacitor C1 and a second capacitor C2.

Structures and functions of the organic light-emitting diode OLED, the driving transistor Tdr, the switching transistor Tsw, the sensing transistor Tss, the emission transistor Tem, and the first capacitor C1 are the same as the structures and the functions described above with reference to FIG. 4.

The second capacitor C2 increases an efficiency of a data voltage during a programming period, and during an emission period, the second capacitor C2 enhances a holding characteristic.

A detailed method of operating a circuit having the above-described configuration is disclosed in Korean Patent Application No. 10-2014-0097537 filed by the applicant. The detailed method of operating the circuit is not a feature of the present invention, and thus, its detailed description is not provided.

First, in the TFT substrate having the above-described structure, the node BSM may be provided in the buffer to overlap and to be insulated from at least one of nodes which are connected to the driving transistor Tdr, the switching transistor Tsw, or the sensing transistor Tss. The transistors may be on the buffer.

To provide an additional description, at least one of a node BSM connected to one of electrodes of the driving transistor Tdr, a node BSM connected to one of electrodes of the switching transistor Tsw, and a node BSM connected to one of electrodes of the sensing transistor Tss may be formed in the buffer.

Particularly, the node BSM may be provided in the buffer to overlap and to be insulated from a node (e.g., a first node n1, a second node n2 or a third node n3 illustrated in FIG. 21) connected to a source electrode or a drain electrode of the driving transistor Tdr.

Moreover, the node BSM may be provided in the buffer to overlap and to be insulated from at least one (e.g., the third node n3) of the first, the second and third nodes n1, n2, n3. For example, when the driving transistor Tdr is turned off, the third node n3 may be floated. Therefore, a parasitic capacitance may be generated between the third node n3 and peripheral nodes due to a change in an electric charge which occurs near the lower substrate or the third node n3. The parasitic capacitance may change a level of a current which flows to the organic light-emitting diode OLED through the third node n3, and for this reason, the organic light-emitting diode OLED cannot normally operate. To prevent the parasitic capacitance from being generated, the node BSM may be provided in the buffer to overlap and to be insulated from the third node n3.

Particularly, as illustrated in FIG. 21, when the sensing transistor Tss is connected to the third node n3 and is connected to an initialization voltage supply line IVL through which an initialization voltage Vini is supplied, a parasitic capacitance may be generated between the third node n3 and the initialization voltage supply line IVL. To prevent the parasitic capacitance from being generated, the node BSM may be provided in the buffer to overlap and to be insulated from the third node n3.

To provide an additional description, the node BSM may overlap one of a plurality of component interconnecting nodes in the pixel 110 illustrated FIG. 21 (in this description, the node is the 'component interconnecting node' and the 'component interconnecting node' is conductive wire or line connecting two or more components (e.g., TFTs or capacitors) each other). In this case, when the node is floated, a parasitic capacitance may be generated between the node and a conductive element (e.g., a metal line or an electrode) near the node due to a change in an electric charge which occurs near the node. However, when the node BSM is provided between the conductive element and the node, a parasitic capacitance is not generated between the node and the conductive element near the node.

For example, when the node BSM is not provided, an unstable, parasitic capacitance may be generated between the third node n3 and the conductive element formed of a metal material, and due to the parasitic capacitance, an amount of current flowing to the third node n3 may be uncontrollably changed or a voltage applied to the third node n3 may be uncontrollably shifted. However, when the node BSM is in between the third node n3 and the conductive element, the parasitic capacitance is not directly generated between the third node n3 and the conductive element.

In this case, when the node BSM to which a predetermined voltage is applied is between the third node n3 and the conductive element, a capacitance having a controllable value may be generated between the third node n3 and the conductive element. The capacitance may be previously calculated in a process of manufacturing a display device and a value of each element configuring the pixel 110 may be calculated based on the calculated capacitance. Accordingly, the pixel circuit is stably driven.

Moreover, the node BSM is included in the buffer, but may not correspond to the TFT included in the pixel 110 illustrated in FIG. 21. Therefore, the node BSM may be provided in the buffer to correspond to a node connected to various kinds of TFTs in a TFT substrate.

The node BSM may be connected to one of various fixed power sources Vdd, Vss and Vini or may be connected to a source electrode or a gate electrode of a TFT which is connected to a node overlapping the node BSM.

Particularly, when the node BSM corresponding to the third node n3 is connected to a first driving power line PL1, a third capacitor C3 in addition to the second capacitor C2 may be additionally connected to the first driving power line PL1 and the third node n3. Due to the third capacitor C3, an efficiency of a data voltage is enhanced during the programming period, and a holding characteristic is enhanced during an emission period.

In this case, a parasitic capacitance may be generated between the node BSM and the initialization voltage supply line IVL. However, due to the node BSM, the parasitic capacitance cannot affect the third node n3.

The BSM overlapping a TFT which has been described above in detail with reference to FIGS. 5A to 20 and the node BSM overlapping a node may be in one pixel together.

Figure 22:
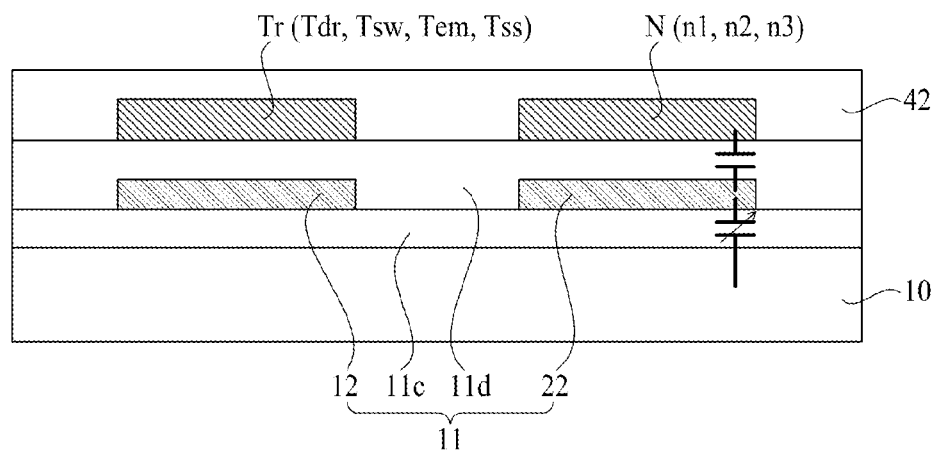
FIG. 22 is an exemplary diagram illustrating a cross-sectional surface of the TFT substrate according to the sixth embodiment of the present invention.

FIG. 22 is an exemplary diagram illustrating a cross-sectional surface of a TFT substrate according to the sixth embodiment of the present invention. In the following description, details which are the same as or similar to the above-described details are not described or will be briefly described.

As illustrated in FIG. 22, the TFT substrate according to the sixth embodiment of the present invention may include a lower substrate 10, a buffer 11 which is on the lower substrate 10, a TFT Tr (e.g. a driving transistor Tdr, a sensing transistor Tss, an emission transistor Tem, a switching transistor Tsw or TFTs in non-display area) which is on the buffer 11, and is insulated from a BSM 12, a component interconnecting node N (e.g., a first node n1, a second node n2 or a third node n3) which is insulated from a node BSM 22 configuring the buffer 11, and is on the buffer 11, the component interconnecting node N overlaps the node BSM 22, and is floated, an organic light-emitting diode OLED which is disposed on an insulation layer covering the one or more transistors and is driven by the driving transistor Tdr to emit light. Although not illustrated in FIG. 22, the node BSM 22 is connected to a gate electrode, a source electrode or a drain electrode of the TFT Tr, or one of fixed power sources Vdd, Vini and Vss.

In FIG. 22, the TFT Tr may be various kinds of TFTs included in the pixel 110 of FIG. 21 or various types of TFTs included in the non-display area of the TFT substrate.

In this case, the node BSM 22 may be in the buffer 11 which is under the node N. Although not illustrated in FIG. 22, The BSM 12 corresponding to the TFT Tr and the node BSM 22 corresponding to the component interconnecting node N may be integrated to each other and single said integrated BSM may cover the TFT Tr and the component interconnecting node N together in the case that the node BSM 22 is not connected to one of the fixed power sources Vdd, Vini and Vss. That is, when the node BSM 22 is connected to one of electrodes of TFTs, the node BSM 22 may be extended in order to cover a TFT.

For example, the node BSM 22 is on the third node n3 which is floated most of periods of an operation of the pixel circuit and is connected to a gate electrode, a source electrode or a drain electrode of the sensing transistor Tss. floated at least some period during an operation of the pixel circuit.

To provide an additional description, the BSM 12 may not be under a TFT connected to the component interconnecting node N corresponding to the node BSM 22.

Moreover, in the present embodiment, the node BSM 22 is necessarily included in the buffer 11, but the BSM 12 may not be included in the buffer 11.

Second, the TFT Tr illustrated in FIG. 22 may be the driving transistor Tdr illustrated in FIG. 21 that controls an amount of current flowing to the organic light-emitting diode OLED. In this case, the component interconnecting node N illustrated in FIG. 22 may be the third node n3 illustrated in FIG. 21, connected to the source electrode of the driving transistor Tdr and the organic light-emitting diode OLED.

Third, when the component interconnecting node N illustrated in FIG. 22 is the third node n3 illustrated in FIG. 21, the sensing transistor Tss illustrated in FIG. 21 which is used for the internal compensation of the driving transistor Tdr may be connected between the component interconnecting node N and the initialization voltage supply line IVL. In this case, a gate of the sensing transistor Tss may be connected to a sensing control line SSL.

The lower substrate 10 may be provided on an auxiliary substrate (not shown) that includes a base substrate (not shown) and a sacrificial layer (not shown), and in this case, the lower substrate 10 may be formed of plastic. However, the lower substrate 10 may be a glass carrier and may be formed of various kinds of materials.

The buffer 11 may include a multi-buffer 11c which is formed on the lower substrate 10, the BSM 12 and the node BSM 22 which are formed on the multi-buffer 11c, an active buffer 11d which is formed on the BSM 12 and the node BSM 22. However, the present embodiment is not limited thereto.

An active layer (not shown), a planarization layer 42, a gate (not shown), an interlayer dielectric (not shown) may be formed on the buffer 11. In other words, the driving transistor Tdr, the switching transistor Tsw, the emission transistor Tem and the sensing transistor Tss may be formed on the buffer 11. Also, the component interconnecting node N may be formed on the buffer 11.

A passivation layer (not shown) and a planarization layer (not shown) may be sequentially formed on the driving transistor Tdr, the switching transistor Tsw, the emission transistor Tem and the sensing transistor Tss.

The organic light-emitting diode OLED connected to the source electrode of the driving transistor Tdr may be formed on the planarization layer (not shown).

In the TFT substrate according to the sixth embodiment of the present invention, the node BSM 22 may be disposed under the third node n3 which is connected to the source of the driving transistor Tdr and is floated when the driving transistor Tdr is turned off. Also, the node BSM 22 may be connected to the first driving power line PL1 through which the first voltage Vdd is supplied.

In this case, even when a parasitic capacitance occurs near the third node n3 due to influences of a temperature and humidity, the parasitic capacitance is blocked by the node BSM 22, and thus, the third node n3 is not affected by the parasitic capacitance.

Moreover, a capacitance between the first driving power line PL1 and the third node n3 increases by an area of the node BSM 22, and thus, an efficiency of a data voltage is enhanced during the programming period.

Hereinafter, a method of manufacturing the TFT substrate according to the sixth embodiment of the present invention will be described in detail.

First, the multi-buffer 11c may be provided on the lower substrate 10, for manufacturing the TFT substrate according to the sixth embodiment of the present invention.

Subsequently, the node BSM 22 may be provided on the multi-buffer 11c corresponding to the component interconnecting node N. In this case, the BSM 12 may be provided in a region corresponding to the TFT Tr. However, the BSM 12 may not be provided.

Subsequently, the active buffer 11d may be provided on the node BSM 22, and then, the active layers (not shown) respectively configuring the driving transistor Tdr, the switching transistor Tsw, and the sensing transistor Tss and the component interconnecting node N may be provided on the active buffer 11d.

Subsequently, the gate insulation layer (not shown) may be on the active layers (not shown) and the component interconnecting node N, and then, the gates (not shown) respectively configuring the driving transistor Tdr, the switching transistor Tsw, and the sensing transistor Tss and a scan control line SCL, an emission signal line EML, and a sensing control line SSL which are connected to the gates (not shown) may be on the gate insulation layer (not shown).

Subsequently, the initialization voltage supply line IVL, the first driving power line PL1, and the data line DL may be insulated from the gates (not shown) and the lines.

Finally, the planarization layer 42 may be on the component interconnecting node N and the driving transistor Tdr, the switching transistor Tsw, and the sensing transistor Tss and a scan control line SCL, an emission signal line EML, a sensing control line SSL, the initialization voltage supply line IVL, the first driving power line PL1, and the data line DL.

Therefore, the driving transistor Tdr, the switching transistor Tsw, the sensing transistor Tss, and the component interconnecting node N may be formed on the TFT substrate.

The above-described sixth embodiment will be summarized below.

First, according to the present invention, the TFT Tr on the BSM 12 may be the driving transistor Tdr which is the most sensitive to an electric charge generated from the lower substrate 10 formed of a plastic material, and the BSM 12 may be connected to the source electrode or the gate electrode of the driving transistor Tdr. Therefore, the driving transistor Tdr is not affected by a change in an electric charge near the driving transistor Tdr. Accordingly, a current is prevented from being changed in the driving transistor Tdr, and noise which causes image sticking is reduced.

The BSM 12 may be disposed under a TFT Tr in addition to the driving transistor Tdr. In this case, the BSM 12 may be connected to a source electrode or a gate electrode of the TFT Tr or separate fixed power sources (Vdd, Vini and Vss), based on a characteristic of the TFT Tr. Therefore, the TFT Tr is not affected by a change in an electric charge near the TFT Tr. Accordingly, a current is prevented from being shifted in the TFT Tr, and noise which causes image sticking is reduced.

To provide an additional description, the BSM 12 is under at least one of TFTs Tr in the TFT substrate respectively, and thus, even when an electric field applied to a lower end of the TFT Tr is changed due to a change in an electric charge generated from the lower substrate 10, the TFT Tr is not affected by the change in the electric charge. In the present invention, the BSM 12 may or may not be in the buffer 11.

Second, according to the present invention, the node BSM 22 may be under a component interconnecting node N (e.g., the third node n3) which is connected to one of TFTs (e.g., the driving transistor Tdr) in a TFT substrate and is affected by a change in an electric charge near the component interconnecting node N and the TFT which is connected to the component interconnecting node N may be the TFT Tr on the BSM 12. Therefore, when the node BSM 22 is under the component interconnecting node N which is floated, the component interconnecting node N is not affected by the change in the electric charge near the component interconnecting node N, which is more beneficial when the node BSM 22 is not floated in the way of connecting to a source electrode or a gate electrode of the TFT or separate fixed power sources (Vdd, Vini and Vss). Accordingly, a current is prevented from being changed in the component interconnecting node N, and noise which causes image sticking is reduced.

To provide an additional description, because the node BSM 22 is under a component interconnecting node N connected to a floated TFT, a voltage of the component interconnecting node N is not shifted despite an electric charge near the component interconnecting node N being changed. That is, the component interconnecting node N is not affected by the change in the electric charge near the component interconnecting node N.

In this case, the node BSM 22 may be under a component interconnecting node N connected to a transistor other than the driving transistor Tdr or may be under an area where a parasitic capacitance is generated in the TFT substrate.

Third, according to the present invention, the BSM 12 is under a TFT Tr in the pixel circuit of the TFT substrate, and moreover, the node BSM 22 is under a component interconnecting node N in the pixel circuit of the TFT substrate which is connected to the TFT in a floating state.

In this case, the BSM 12 may be connected to one of various fixed power sources Vdd, Vss, and Vini or one of a source electrode and a gate electrode of the TFT Tr. Also, the node BSM 22 may be connected to one of the various fixed power sources Vdd, Vss, and Vini or one of the source electrode and the gate electrode of the TFT Tr.

To provide an additional description, in the present invention, the BSM 12 may be under a TFT Tr which is affected by a change in an electric charge generated from the lower substrate 10 formed of a plastic material, and the node BSM 22 may be under a component interconnecting node N (e.g., the third node n3) which is connected to one of electrodes of the floated TFT (e.g., the driving transistor Tdr), and the node BSM 22 is connected to one of various fixed power sources (Vdd, Vss, and Vini) or a source electrode or a gate electrode of a TFT which is not floated at least during the emission period in the operation of the pixel circuit. Accordingly, a stable current is supplied to the organic light-emitting diode OLED.

According to the embodiments of the present invention, provided is the TFT substrate including the buffer 11 where the BSM 12, 22 is provided, and thus, a threshold voltage of a TFT is prevented from being shifted due to a back channel phenomenon which is caused by the lower substrate 10 and the sacrificial layer 85.

Moreover, according to the embodiments of the present invention, a threshold voltage of a TFT is prevented from being shifted, and thus, a reliability of each of the TFT substrate and the display panel including the same is enhanced.

Moreover, according to the embodiments of the present invention, the node BSM 22 is in a region of the buffer 11 corresponding to a component interconnecting node N connected to a TFT (e.g., a floated TFT), and thus, a device characteristic of the TFT or an amount of current flowing in the component interconnecting node N is prevented from being changed by a parasitic capacitance which occurs in the component interconnecting node N.

Particularly, the node BSM 22 is in a region of the buffer 11 corresponding to a component interconnecting node N connected to a driving transistor Tdr which controls an amount of current induced to an OLED. Accordingly, a device characteristic of the driving transistor Tdr is prevented from being changed, and an amount of current induced to the OLED is prevented from being changed.

Moreover, according to the embodiments of the present invention, a reliability of each of the TFT substrate or the display panel including the same is prevented from being degraded by a particle having an electric charge or an electric field which is generated by polarization.

In an aspect of the present disclosure of the invention an electronic display panel comprises: a plastic substrate, a bottom shield metal (BSM) on the plastic substrate, a thin-film transistor (TFT) on the BSM, the TFT and the BSM being arranged to at least partially overlap each other and an active buffer layer interposed between the TFT and the BSM. The BSM is connected to one of a gate, a source and a drain electrode of the TFT.

According to another feature of the present disclosure, the TFT on the BSM is one of a plurality of switching TFTs of the plastic substrate, and wherein a length of the BSM is less than a length of a gate electrode of the TFT.

According to still another feature of the present disclosure, an active layer of the TFT includes a plurality of doping areas and a channel between the doping areas that has lower doping-concentration than the doping areas, wherein a length of the channel is greater than a length of the BSM, and wherein the length of the channel covers the entire length of the BSM.

According to still another feature of the present disclosure, each of the doping areas includes a plurality of low-concentration doped portions and a plurality of high-concentration doped portions positioned further away from the channel than the low-concentration doped portion in the respective doping area, wherein the BSM overlaps entire portion of at least one of the low-concentration doped portions, and wherein the BSM partially overlaps at least one of the high-concentration doped portions.

According to still another feature of the present disclosure, the TFT on the BSM is a driving TFT of the plastic substrate, and wherein a length of the BSM is equal to or greater than a length of a gate electrode of the TFT.

According to still another feature of the present disclosure, an active layer of the TFT includes a plurality of doping areas and a channel between the doping areas that has lower doping-concentration than the doping areas, wherein a length of the channel is equal to or shorter than a length of the BSM, and wherein the length of the BSM covers the entire length of the channel.

According to still another feature of the present disclosure, each of the doping areas includes a plurality of low-concentration doped portions and a plurality of high-concentration doped portions positioned further away from the channel than the low-concentration doped portion in the respective doping area, wherein the BSM partially overlaps at least one of the low-concentration doped portions.

According to still another feature of the present disclosure, the TFT and the BSM is arranged to overlap asymmetrically each other and the TFT is one of a plurality of switching TFTs of the plastic substrate.

According to still another feature of the present disclosure, the TFT is a dual gate TFT branching the gate electrode thereof into a first gate electrode terminal and a second gate electrode terminal, the TFT configured with the channel provided with a first channel corresponding to the first gate electrode terminal and a second channel corresponding to the second gate electrode terminal, wherein the BSM is placed under at least one of the first channel and the second channel.

According to still another feature of the present disclosure, the BSM overlaps either the first channel or the second channel, wherein a length of said either one of the first channel or the second channel is equal to or shorter than a length of the BSM, and wherein the length of the BSM covers the entire length of the said either one of the first channel or the second channel, and wherein the TFT on the BSM is a driving TFT of the plastic substrate.

According to still another feature of the present disclosure, the BSM is closer to the drain electrode than the source electrode of the TFT.

According to still another feature of the present disclosure, the BSM is closer to either one that is supplied a higher voltage among a source electrode and a drain electrode of the TFT thereon.

According to still another feature of the present disclosure, the TFT on the BSM is in a pixel circuit and the BSM is arranged to extend under at least one of a plurality of component interconnecting nodes in the pixel circuit, and wherein the component interconnecting node is floated at least some period during an operation of the pixel circuit.

According to still another feature of the present disclosure, said at least some period during an operation of the pixel circuit is emission period of the organic light-emitting diode (OLED).

In another aspect of the invention an electronic display panel comprises a plastic substrate, a bottom shield metal (BSM) on the plastic substrate, the BSM being positioned to minimize formation of back channel in the pixel circuit by trapped charges of the plastic substrate, an active buffer layer on the BSM and a pixel circuit in a pixel area defined by a gate line and a data line on the plastic substrate, the pixel circuit on the active buffer layer including a plurality of TFTs and a plurality of component interconnecting nodes.

According to another feature of the present disclosure, the BSM overlaps one of the TFTs of the pixel circuit, and is connected to one of a gate, a source and a drain electrode of the TFT overlapping with the BSM.

According to still another feature of the present disclosure, an active layer of the TFT includes a plurality of doping areas and a channel between the doping areas that has lower doping-concentration than the doping areas, wherein a length of the channel is equal to or shorter than a length of the BSM, and wherein the length of the BSM covers the entire length of the channel.

According to still another feature of the present disclosure, the BSM overlaps one of the component interconnecting nodes floated at least some period during an operation of the pixel circuit, and is connected to one of a plurality of power sources of the pixel circuit.

According to still another feature of the present disclosure, the BSM is arranged to extend under at least one of the TFTs in the pixel circuit.

Features of various exemplary embodiments of the present invention may be combined partially or totally. As will be clearly appreciated by those skilled in the art, technically various interactions and operations are possible. Various exemplary embodiments can be practiced individually or in combination.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An electronic display panel comprising:
   a plastic substrate;
   a bottom shield metal (BSM) on the plastic substrate;
   a thin-film transistor (TFT) on the BSM, the TFT and the BSM at least partially overlapping each other; and
   an active buffer layer between the TFT and the BSM,
   wherein the BSM is connected to one of a gate electrode, a source electrode, and a drain electrode of the TFT,
   wherein an active layer of the TFT includes a plurality of doping areas and a channel between the doping areas that has lower doping-concentration than the doping areas,
   wherein a length of the channel is greater than a length of the BSM, and
   wherein the length of the channel covers an entire length of the BSM.

2. The electronic display panel of claim 1, wherein the TFT is one of a plurality of switching TFTs of the plastic substrate, and
   wherein a length of the BSM is less than a length of the gate electrode of the TFT.

3. The electronic display panel of claim 1, wherein each of the doping areas includes a plurality of low-concentration doped portions and a plurality of high-concentration doped portions further away from the channel than the low-concentration doped portions in the respective doping area,
   wherein the BSM overlaps an entire portion of at least one of the low-concentration doped portions, and
   wherein the BSM partially overlaps at least one of the high-concentration doped portions.

4. The electronic display panel of claim 1, wherein the TFT on the BSM is a driving TFT of the plastic substrate, and
   wherein a length of the BSM is greater than or equal to a length of the gate electrode of the TFT.

5. The electronic display panel of claim 1, wherein the TFT and the BSM asymmetrically overlap each other, and wherein the TFT is one of a plurality of switching TFTs of the plastic substrate.

6. The electronic display panel of claim 1, wherein the TFT is a dual gate TFT branching the gate electrode thereof into a first gate electrode terminal and a second gate electrode terminal, the TFT including the channel having a first channel corresponding to the first gate electrode terminal and a second channel corresponding to the second gate electrode terminal, and
   wherein the BSM is under at least one of the first channel and the second channel.

7. The electronic display panel of claim 6, wherein the BSM overlaps either the first channel or the second channel,
   wherein a length of one of the first channel and the second channel is less than or equal to a length of the BSM, and
   wherein the length of the BSM covers an entire length of the one of the first channel and the second channel, and
   wherein the TFT is a driving TFT of the plastic substrate.

8. The electronic display panel of claim 7, wherein the BSM is closer to the drain electrode than the source electrode of the TFT.

9. The electronic display panel of claim 6, wherein the BSM is closer to one that is supplied a higher voltage among the source electrode and the drain electrode of the TFT.

10. The electronic display panel of claim 1, wherein the TFT on the BSM is in a pixel circuit and the BSM extends under one of a plurality of component interconnecting nodes in the pixel circuit, and
    wherein the component interconnecting node is floated during a period of operation of the pixel circuit.

11. The electronic display panel of clam 10, wherein the period is an emission period of an organic light-emitting diode (OLED).

12. An electronic display panel comprising:
    a plastic substrate;
    a bottom shield metal (BSM) on the plastic substrate, the BSM located to minimize formation of a back channel in a pixel circuit by trapped charges of the plastic substrate;
    an active buffer layer on the BSM; and
    the pixel circuit in a pixel area defined by a gate line and a data line on the plastic substrate, the pixel circuit on the active buffer layer including a plurality of TFTs and a plurality of component interconnecting nodes,
    wherein the BSM overlaps one of the TFTs of the pixel circuit and is connected to one of a gate electrode, a source electrode, and a drain electrode of the one of the TFTs overlapping the BSM,
    wherein an active layer of the TFT includes a plurality of doping areas and a channel between the doping areas that has lower doping-concentration than the doping areas,
    wherein a length of the channel is less than or equal to a length of the BSM, and
    wherein the length of the BSM covers an entire length of the channel.

13. The electronic display panel of claim 12, wherein the BSM overlaps one of the component interconnecting nodes floated at during a period of operation of the pixel circuit and is connected to one of a plurality of power sources of the pixel circuit.

14. The electronic display panel of claim 12, wherein the BSM extends under one of the TFTs in the pixel circuit.

* * * * *